US012612731B2

(12) United States Patent
Wang et al.

(10) Patent No.: US 12,612,731 B2
(45) Date of Patent: Apr. 28, 2026

(54) STRUCTURES WITH TUNABLE STIFFNESS

(71) Applicant: CALIFORNIA INSTITUTE OF TECHNOLOGY, Pasadena, CA (US)

(72) Inventors: Yifan Wang, Singapore (SG); Chiara Daraio, South Pasadena, CA (US); Douglas C Hofmann, Altadena, CA (US); Liuchi Li, Berkeley, CA (US); Jose E Andrade, Pasadena, CA (US)

(73) Assignee: CALIFORNIA INSTITUTE OF TECHNOLOGY, Pasadena, CA (US)

( * ) Notice: Subject to any disclaimer, the term of this patent is extended or adjusted under 35 U.S.C. 154(b) by 883 days.

(21) Appl. No.: 17/748,626

(22) Filed: May 19, 2022

(65) Prior Publication Data

US 2023/0052509 A1 Feb. 16, 2023

Related U.S. Application Data

(60) Provisional application No. 63/195,606, filed on Jun. 1, 2021.

(51) Int. Cl.
*D06N 7/00* (2006.01)
*B33Y 80/00* (2015.01)
*G06F 30/17* (2020.01)

(52) U.S. Cl.
CPC .............. *D06N 7/00* (2013.01); *B33Y 80/00* (2014.12); *G06F 30/17* (2020.01)

(58) Field of Classification Search
CPC .... B32B 3/00; B32B 3/02; B32B 3/06; B32B 30/30
See application file for complete search history.

(56) References Cited

U.S. PATENT DOCUMENTS

| | | | |
|---|---|---|---|
| 2009/0324904 A1* | 12/2009 | Mason | B81C 3/002 |
| | | | 430/325 |
| 2012/0310126 A1 | 12/2012 | Bureau et al. | |
| 2015/0107233 A1* | 4/2015 | Ou | F16J 3/02 |
| | | | 92/6 D |
| 2017/0183870 A1 | 6/2017 | Cheung et al. | |
| 2017/0268374 A1* | 9/2017 | Sellinger | F02C 7/042 |
| 2017/0360590 A1 | 12/2017 | Corrigan et al. | |
| 2019/0106916 A1 | 4/2019 | Sutherland et al. | |
| 2021/0086697 A1* | 3/2021 | Hurd | B60P 7/0892 |

FOREIGN PATENT DOCUMENTS

WO 2022/256182 A2 12/2022

OTHER PUBLICATIONS

International Search Report and Written Opinion for International Application No. PCT/US2022/030052 filed May 19, 2022 on behalf of California Institute of Technology, Mail Date: Feb. 1, 2023. (11 pages).

(Continued)

*Primary Examiner* — Andrew L Swanson
(74) *Attorney, Agent, or Firm* — Steinfl + Bruno LLP

(57) ABSTRACT

A structure having a tunable modulus of bending (flexibility) composed of interlocking geometric particles arranged such that an external pressure/force causes them to jam together, increasing the stiffness of the overall structure. Methods for creating the external pressure can include the use of an envelope around the structure that can be evacuated of air.

14 Claims, 19 Drawing Sheets

(56)            References Cited

OTHER PUBLICATIONS

Ashby M.F. "The properties of foams and lattices", *Phil. Trans. R. Soc. A*, vol. 364, (2006), pp. 15-30.
Athanassiadis A.G. et al., "Particle shape effects on the stress response of granular packings", *Soft Matter*, vol. 10, (2014), p. 48.
Bertoldi K. et al., "Flexible mechanical metamaterials", *Nat. Rev. Mater.*, vol. 2, (2017), p. 17066.
Bi D. et al., "Jamming by shear", *Nature* 480, pp. 355-358 (2011).
Biggs J. et al., "Electroactive polymers: developments of and perspectives for dielectric elastomers." *Angew. Chem. Int. Ed.* 52, 9409-9421 (2013).
Brown E. et al., "Universal robotic gripper based on the jamming of granular material." *PNAS* 107, 44 (2010). pp. 18809-18814.
Brown E. et al., "Strain stiffening in random packings of entangled granular chains." *Phys. Rev. Lett.* 108, pp. 108302-1-108302-4 (2012).
Cai L. et al., "Warming up human body by nanoporous metallized polyethylene textiles." *Nat. Comm.* 8, 496 (2017). pp. 1-8.
Camacho-Lopez M. et al., "Fast liquid-crystal elastomer swims into the dark", *Nat. Mater.*, vol. 3, (2004), pp. 307-310.
Chen J. et al., "Micro-cable structured textile for simultaneously harvesting solar and mechanical energy." *Nat. Energy* 1,16138 (2016). pp. 1-8.
Chen X. et al., "An overview on fabrication of three-dimensional woven textile preforms for composites." *Text. Res. J.* 81, 9 (2011). pp. 1-13.
Cherenack K. et al., "Smart textiles: Challenges and opportunities." *J. Appl. Phys.* 112, pp. 091301-091301-14 (2012).
Cherenack K. et al., "Woven electronic fibers with sensing and display functions for smart textiles." *Adv. Mater.* 22, pp. 5178-5182 (2010).
Cundall P. A. et al., "A discrete numerical model for granular assemblies." *Geotechnique* 29, 47-65 (1979).
Deshmukh S.S. et al., "Adaptive energy-absorbing materials using field-responsive fluid-impregnated cellular solids", *Smart Mater. Struct.*, vol. 16, (2007), pp. 106-113.
Dyskin A. V. et al., "A new concept in design of materials and structures: assemblies of interlocked tetrahedron-shaped elements." *Scripta Mater.* 44, 2689-2694 (2001).
Dyskin A. V. et al., "Mortarless structures based on topological interlocking." *Front. Struct. Civ. Eng.* 6(2): 188-197 (2012).
Engel J. et al., "Creation of a metallic micromachined chain mail fabric." *J. Micromech. Microeng.* 17, 551-556 (2007).
Gauvreau B. et al., "Color-changing and color-tunable photonic bandgap fiber textiles." *Opt. Express* 16, 20 (2008). pp. 15677-15693.
Jackson J. A. et al., "Field responsive mechanical metamaterials." *Sci. Adv.* 4, eaau6419 (2018). pp. 1-9.
Jaeger H. "Celebrating soft matter's 10th anniversary: Toward jamming by design." *Soft Matter*, 11, pp. 12-27 (2015).
Jani J.M. et al., "A review of shape memory alloy research, applications and opportunities", *Materials & Design*, vol. 56, (2014), pp. 1078-1113.
Jiang Y. et al., "Highly-stretchable 3D-architected mechanical metamaterials", *Sci. Rep.*, vol. 6, (2016), pp. 1-11.
Kawamoto, R. et al., "All you need is shape: predicting shear banding in sand with LS-DEM." *J. Mech. Phys. Solids* 111, 375-392 (2018).
Kawamoto R. et al., "Level set discrete element method for three-dimensional computations with triaxial case study." *J. Mech. Phys. Solids* 91, pp. 1-13 (2016).
Koetting M.C. et al., "Stimulus-responsive hydrogels: Theory, modern advances, and applications", *Mater. Sci. Eng.*, R. 93, (2015), pp. 1-49.
Kotikian A. et al., "3D printing of liquid crystal elastomeric actuators with spatially programed nematic order", *Adv. Mater.*, (2018), p. 1-6.

Kouwer P.H. et al., "Responsive biomimetic networks from polyisocyanopeptide hydrogels", *Nature*, vol. 493, (2013), pp. 651-655.
Li L. et al., "Capturing the inter-particle force distribution in granular material using LS-DEM," *Granular Matter* 21, 3 (2019). pp. 1-16.
Lindstrom P. A. et al., "Jammed architectural structures: towards large-scale reversible construction." *Granular Matter* 18, 28 (2016). pp. 1-12.
Liu A et al., "Jamming is not just cool any more." *Nature* 396, pp. 21-22 (1998).
Liu A. et al., "The jamming transition and the marginally jammed solid." *Annu. Rev. Condens. Matter Phys.* 1, pp. 347-369 (2010).
Majmudar T. S. et al., "Contact force measurements and stress-induced anisotropy in granular materials." *Nature*, 435, pp. 1079-1082 (2005).
Manti M. et al., "Stiffening in soft robotics." *IEEE Robotics & Automation* 16, 1070-9932 (2016). pp. 93-106.
Meng H. et al., "A review of stimuli-responsive shape memory polymer composites." *Polymer* 54, pp. 2199-2221 (2013).
Meza L.R. et al., "Strong, lightweight, and recoverable three-dimensional ceramic nanolattices," *Science*, vol. 345, (2014), pp. 1322-1326.
Mondal S. "Phase change materials for smart textiles—An overview." *Appl. Therm. Eng.* 28, pp. 1536-1550 (2008).
Narang, Y. S. et al., "Mechanically versatile soft machines through laminar jamming." *Adv. Funct. Mater.* 28, 1707136 (2018) pp. 1-9.
Ploszajski A. et al., "4D printing of magnetically functionalized chainmail for exoskeletal biomedical applications." *MRS Advances*, 4, 23 (2019). pp. 1-6.
Ramirez B.J. et al., "Energy absorption and low velocity impact response of open-cell polyurea foams", *J. Dynamic Behavior Mater.*, vol. 5 (2019), pp. 132-142.
Ramirez B.J. et al., "Viscoelastic foam-filled lattice for high energy absorption", *Mech Mater.* vol. 127, (2018), pp. 39-47.
Royer J.R. et al., "The role of interstitial gas in determining the impact response of granular beds", *EPL*, vol. 93, (2011), pp. 1-6.
Shan S. et al., "Multistable architected materials for trapping elastic strain energy", *Adv. Mater.*, vol. 27, (2015), p. 4296-4301.
Steltz E. et al., "Jamming as an enabling Technology for Soft Robotics", *Proc. SPIE 7642, Electroactive Polymer Actuators and Devices (EAPAD)*, (2010), pp. 764225-764225-9.
Stoppa M. et al., "Wearable electronics and smart textiles: A critical review." *Sensors* 14, pp. 11957-11992 (2014).
Stuart M.A.C. et al., "Emerging applications of stimuli-responsive polymer materials", *Nat Mater.*, vol. 9, (2010), pp. 101-113.
Tabiei A. et al., "Ballistic impact of dry woven fabric composites: a review." *Appl. Mech. Rev.* 61, pp. 010801-010801-13 (2008).
Waitukaitis S.R. et al., "Impact-activated solidification of dense suspensions via dynamic jamming fronts", *Nature*, vol. 487, (2012), pp. 205-209.
Wang L. et al., "Controllable and reversible tuning of material rigidity for robot applications." *Mater. Today* 21, 5 (2018). pp. 563-576.
Wang Y. et al., "Architected lattices with adaptive energy absorption." *Extreme Mech. Lett.* 33, 100557 (2019). pp. 1-6.
White T. J. et al., "Programmable and adaptive mechanics with liquid crystal polymer networks and elastomers." *Nat. Mater.* 14, pp. 1087-1098 (2015).
Yuan S. et al., "3D-printed mechanical metamaterials with high energy absorption", *Adv. Mater. Technol.* (2018), pp. 1-9.
Zadpoor A. A. et al., "Mechanical meta-materials", *Mater. Horiz.*, vol. 3, (2016), pp. 371-381.
Zheng X. et al., "Ultralight, ultrastiff, mechanical metamaterials", *Science*, vol. 344, (2014), pp. 1373-1377.
Zweben, C. et al., "Test methods for fiber tensile strength, composite flexural modulus, and properties of fabric-reinforced laminates." *Composite Materials: Testing and Design (Fifth Conference)*, pp. 228-262 (1979).
Alezi, I. Spanopoulos, C. Tsangarakis, A. Shkurenko, K. Adil, Y. Belmabkhout, M. O Keeffe, M. Eddaoudi, P. N. Trikalitis, Reticular chemistry at its best: directed assembly of hexagonal building units

(56) References Cited

OTHER PUBLICATIONS into the awaited metal-organic framework with the intricate polybenzene topology, pbz-MOF. J. Am. Chem. Soc. 138, 12767-12770 (Sep. 10, 2016).

Al-Ketan O., A Soliman, AM. AlQubaisi, R. K. Abu Al-Rub, Nature-inspired lightweight cellular co-continuous composites with architected periodic gyroidal structures. Adv. Eng. Mater. 20, 1700549 (2018).

Al-Ketan O., R. K. Abu Al-Rub, Multifunctional mechanical metamaterials based on triply periodic minimal surface lattices. Adv. Eng. Mater. 21, 1900524 (2019). 39 pages.

Arabnejad S., D. Pasini, Mechanical properties of lattice materials via asymptotic homogenization and comparison with alternative homogenization methods. Int. J Mech. Sci. 77, 249-262 (Oct. 11, 2013).

Babaee S., J. Shim, J.C. Weaver, E. R. Chen, N. Patel, K. Bertoldi, 3D soft metamaterials with negative Poisson's ratio. Adv. Mater 25, 5044-5049 (2013).

Boddapati, M. Flaschel, S. Kumar, L. De Lorenzis, C. Daraio, Single-test evaluation of directional elastic properties of anisotropic structured materials. J Mech. Phys. Solids 181, 105471 (Oct. 21, 2023).

Buckmann, M. Thiel, M. Kadic, R. Schittny, M. Wegener, An elasto-mechanical unfeelability cloak made of pentamode metamaterials. Nat. Commun. 5, 4130 (Jun. 19, 2014).

Burdett, T. Hughbanks, NbO and TiO: structural and electronic stability of structures derived from rock salt. J. Am. Chem. Soc. 106, No. 11 3101-3113 (1984).

Carlucci, G. Ciani, D. M. Proserpio, Polycatenation, polythreading and polyknotting in coordination network chemistry. Coard Chem. Rev. 246, 247-289 (2003).

Chong, M. A Porter, P. G. Kevrekidis, C. Daraio, Nonlinear coherent structures in granular crystals. J Phys. Condens. Matter 29, 413003 (Sep. 6, 2017).

Coulais, A Sabbadini, F. Vink, M. van Hecke, Multi-step self-guided pathways for shape-changing metamaterials. Nature 561, 512-515 (Sep. 27, 2018).

Da Cruz, S. Emam, M. Prochnow, J.-N. Roux, F. Chevoir, Rheophysics of dense granular materials: Discrete simulation of plane shear flows. Phys. Rev. E 72, 21309 (Aug. 31, 2005).

Davami K., L. Zhao, E. Lu, J. Cortes, C. Lin, D. E. Lilley, P. K. Purohit, I. Bargatin, Ultralight shape-recovering plate mechanical metamaterials. Nat. Commun. 6, 10019 (Dec. 3, 2015).

De Goede, K. G. de Bruin, D. Bonn, High-velocity impact of solid objects on Non-Newtonian Fluids. Sci. Rep. 9, 1250 (Feb. 4, 2019).

Estrin, A V Dyskin, E. Pasternak, Topological interlocking as a material design concept. Mater. Sci. Eng. C 31, 1189-1194 (2011).

Florijn, C. Coulais, M. van Hecke, Programmable Mechanical Metamaterials. Phys. Rev. Lett. 113, 175503 (2014).

Frenzel T., M. Kadic, M. Wegener, Three-dimensional mechanical metamaterials with a twist. Science 358, 1072-107 4 (Nov. 24, 2017).

Ganghoffer J.F., A Wazne, H. Reda, Frontiers in homogenization methods towards generalized continua for architected materials. Mech. Res. Commun. 130, 104114 (Apr. 27, 2023). 24 pages.

Grima, K. E. Evans, Auxetic behavior from rotating squares. J. Mater. Sci. Lett. 19, 1563-1565 (2000).

Guden M, E. Celik, A. Hzal, M. Altndi, S. Cetiner, Effects of compaction pressure and particle shape on the porosity and compression mechanical properties of sintered Ti6Al4V powder compacts for hard tissue implantation. J. Biomed. Mater. Res. Part B Appl. Biomater. 85B, 547-555 (ePub: Dec. 12, 2007).

Haghpanah, L. Salari-Sharif, P. Pourrajab, J. Hopkins, L. Valdevit, Multistable shape- reconfigurable architected materials. Adv. Mater 28, 7915-7920 (2016).

Hurley, S. A. Hall, J. E. Andrade, J. Wright, Quantifying interparticle forces and heterogeneity in 3D granular materials. Phys. Rev. Lett. 117, 98005 (Aug. 26, 2016). 5 pages.

International Preliminary Report on Patentability for International Application No. PCT/US2022/030052 filed May 19, 2022 on behalf of California Institute of Technology, Mail Date: Dec. 14, 2023. (8 pages).

Kadic M., G. W. Milton, M. van Hecke, M. Wegener, 3D metamaterials. Nat. Rev. Phys. 1, 198-210 (Mar. 2019).

Kadic, T. Buckmann, N. Stenger, M. Thiel, M. Wegener, On the practicability of pentamode mechanical metamaterials. Appl. Phys. Lett. 100 (May 7, 2012).

Karuriya, F. Barthelat, Granular crystals as strong and fully dense architecture materials. Proc. Natl. Acad Sci. 120, No. 1, e22 I 5508120 (2023).

Lakes R., Foam Structures with a Negative Poisson's Ratio. Science 235, 1038-1040 (1987).

Laun, Rheological properties of aqueous polymer dispersions. Die Angew. Makromol. Chemie Appl. Macromol. Chem. Phys. 123, 335-359 (1984).

Li, H. Fang, S. Sadeghi, P. Bhovad, K. Wang, Architected origami materials: how folding creates sophisticated mechanical properties. Adv. Mater. 31, 1805282 (2019).

Li, J.E. Andrade, Identifying spatial transitions in heterogenous granular flow. Granul. Matter 22, 52 (May 4, 2020). 16 pages.

Liu K., R. Sun, C. Daraio, Growth rules for irregular architected materials with programmable properties. Science 377, 975-981 (Aug. 26, 2022).

Liu, M. O'Keeffe, M. M. J. Treacy, 0. M. Yaghi, The geometry of periodic knots, polycatenanes and weaving from a chemical perspective: A library for reticular chemistry. Chem. Soc. Rev. 47, 4642-4664 (2018).

Liu, T. Gu, S. Shan, S. H. Kang, J.C. Weaver, K. Bertoldi, Harnessing buckling to design architected materials that exhibit effective negative swelling. Adv. Mater 28, 6619-6624 (2016). 21 pages.

Losert, L. Bocquet, T. C. Lubensky, J.P. Gollub, Particle dynamics in sheared granular matter. Phys. Rev. Lett. 85, 1428 (2000).

Lumpe, T. Stankovic, Exploring the property space of periodic cellular structures based on crystal networks. Proc. Natl. Acad Sci. 118, e2003504118 (2021).

Lun, S. B. Savage, D. J. Jeffrey, N. Chepurniy, Kinetic theories for granular flow: inelastic particles in Couette flow and slightly inelastic particles in a general flowfield. J Fluid Mech. 140, 223-256 (1984).

Mullins, Effect of stretching on the properties of rubber. Rubber Chem. Technol. 21, 281300 (1948). Abstract.

O'Brien, M. R. Jones, B. Lee, C. A. Mirkin, M. N. O'Brien, M. R. Jones, B. Lee, C. A. Mirkin, Anisotropic nanoparticle complementarity in DNA-mediated co-crystallization. Nat. Mater. 14, 833839 (Aug. 2015). 8 pages.

O'Keeffe, M. M. J. Treacy, Embeddings of Graphs: Tessellate and Decussate Structures. Int. J Topal. 1, 1-10 (2024).

Pena, E. Prediction of the softening and damage effects with permanent set in fibrous biological materials. J. Mech. Phys. Solids 59, 1808-1822 (2011).

Raman, The structure and properties of diamond. Curr. Sci. 12, 3342 (Jan. 1943).

Rollier, S. B. Hendricks, L. R. Maxwell, The Crystal Structure of Polonium by Electron Diffraction. J. Chem. Phys. 4, 648652 (Oct. 1, 1936).

Shaikeea, A.J.D, H. Cui, M. O'Masta, X. R. Zheng, V. S. Deshpande, The toughness of mechanical metamaterials. Nat. Mater. 21, 297-304 (Mar. 2022).

Shapeways. Website: www.shapeways.com/materials/fine-detail-plastic-3. Fine Detail Plastic 3D Printing Material. Last updated Aug. 30, 2024.

Tang, S. Corns, B. Thomaszewski, Beyond Chainmail: Computational Modeling of Discrete Interlocking Materials. ACM Trans. Graph. 42, 1-12 (Aug. 2023).

Turner, Ball and stick models for organic chemistry. J. Chem. Educ. 48, 407 (1971).

Wang, et al. "Structured fabrics with tunable mechanical properties", Nature, online: Aug. 11, 2021, vol. 596, 19 pages.

Xia, A Afshar, H. Yang, C. M. Portela, D. M. Kochmann, C. V. Di Leo, J. R. Greer, Electrochemically reconfigurable architected materials. Nature 573, 205-213 (Sep. 12, 2019).

(56) References Cited

OTHER PUBLICATIONS

Xia, C. M. Spadaccini, J. R. Greer, Responsive materials architected in space and time. Nat. Rev. Mater. 7, 683-701 (Sep. 2022).
Xue R., X. Cui, P. Zhang, K. Liu, Y. Li, W. Wu, H. Liao, Mechanical design and energy absorption performances of novel dual scale hybrid plate-lattice mechanical metamaterials. Extrem. Mech. Lett. 40, 100918 (Aug. 11, 2020).
Zaiser M., S. Zapperi, Disordered mechanical metamaterials. Nat. Rev. Phys. 5, 679-688 (Nov. 2023).

* cited by examiner

Tensile $$F \cdot n_1 < 0, \ -F \cdot n_2 < 0$$

Compressive type 1

$$F \cdot n_1 > 0, \ -F \cdot n_2 > 0$$

Compressive type 2

$$(F \cdot n_1)(-F \cdot n_2) < 0$$

Compressive type 3

$$F \cdot n_1 > 0, -F \cdot n_2 > 0$$

| Confining Pressure $P$ (kPa) | | | | | | | | |
|---|---|---|---|---|---|---|---|---|
| 93 | 0.164 | 0.159 | 0.192 | - | 0.166 | - | - | - |
| 79 | 0.165 | 0.160 | 0.189 | - | 0.167 | - | - | - |
| 53 | 0.165 | 0.160 | 0.188 | 0.103 | 0.169 | 0.143 | - | - |
| 40 | 0.166 | 0.160 | 0.188 | 0.116 | 0.170 | 0.142 | 0.419 | 0.405 |
| 25 | - | - | - | - | - | - | 0.418 | 0.404 |
| 13 | 0.161 | 0.157 | 0.181 | 0.109 | 0.169 | 0.143 | 0.417 | 0.403 |
| 2 | 0.155 | 0.152 | 0.175 | 0.09 | 0.161 | - | 0.417 | 0.397 |
| Fitting Parameter $Z_0$ | 4.89 ± 0.05; 5.29 ± 0.13 (45°) | 5.07 ± 0.20; 3.66 ± 0.16 (45°) | 4.68 ± 0.20 | 4.52 ± 0.28 | 4.24 ± 0.12 | 5.06 ± 0.25 | 4.03 ± 0.16 | 4.72 ± 0.42 |
| Fitting Parameters a, b | a=0.159, b=2.348 | | | | | | | |

Fig. 8

| Confining Pressure P (kPa) | Along length | Along width | 45° | Along length | Along width | 45° | Along length | Along width |
|---|---|---|---|---|---|---|---|---|
| | | | | | Poisson's ratio | | | |
| 93 | 0.195 | 0.173 | 0.440 | 0.245 | 0.199 | 0.515 | 0.118 | 0.168 |
| 53 | 0.219 | 0.230 | 0.697 | 0.300 | 0.236 | 0.527 | 0.133 | 0.197 |
| 13 | 0.369 | 0.259 | 0.768 | 0.369 | 0.250 | 0.593 | 0.192 | 0.310 |

Fig. 12

STRUCTURES WITH TUNABLE STIFFNESS

CROSS-REFERENCE TO RELATED APPLICATIONS

The present application is related to U.S. Provisional Patent Application No. 63/195,606 filed on Jun. 1, 2021, the disclosure of which is incorporated herein by reference in its entirety.

STATEMENT OF GOVERNMENT GRANT

This invention was made with government support under Grant No. 80NMO0018D0004 awarded by NASA (JPL) and Grant No(s). W911NF-17-1-0147 and W911NF-19-1-0245 awarded by the Army. The government has certain rights in the invention.

BACKGROUND

Materials and structures with tunable stiffness have many advantages. One example is "smart fabrics". Smart fabrics are wearable materials that sense and respond to environmental stimuli, varying their properties, and/or measuring and communicating data to external recording devices. Their applications include medical monitoring, wearable computing, and energy harvesting. They are usually fabricated by integrating in conventional fabrics with "smart" components, like flexible electronic circuits for sensing and computing, phase changing materials for thermal regulation, or photovoltaic materials for solar energy harvesting. However, most of these solutions focus on sensing and data communication to control the stiffness of the structures.

SUMMARY

Described herein are materials and methods for a type of architected lattice (structure), made of chain mail layers with designed unit particles, which can reversibly and gradually switch between soft and rigid states. These structures with tunable mechanical properties serve as a promising candidate for many uses, such as smart fabrics. Further examples of uses are described herein.

In an aspect of the disclosure, an apparatus is disclosed comprising: a structure composed of a plurality of sheets layered on each other, each sheet comprising interlocking particles; and a means to apply external pressure to the structure such that the interlocking particles become jammed and increase the stiffness of the structure.

In another aspect of the disclosure, a method of controlling the modulus of bending of an object, the object comprising a plurality of sheets of interlocking particles, is disclosed, the method comprising: adjusting an external pressure on the sheet sufficient to jam the interlocking particles, thereby changing the modulus of bending of the plurality of sheets.

In another aspect of the disclosure, a method of designing a structure whose modulus of bending is tunable by application of external pressure, the structure comprising interlocking particles is disclosed, the method comprising: selecting at least one geometry for the interlocking particles; constructing a digital twin of layered sheets of the interlocking particles having the at least one geometry; compute contact forces of the interlocking particles of the digital twin; create digital envelope spheres for each the interlocking particles of the digital twin; create a digital envelope around the digital twin; a triangulate a surface of the digital envelope and assign a sphere of the digital envelope spheres at each node of the surface and a connection at each edge between two neighboring spheres; simulate isotropic compression on the surface; simulate a three-point bending test on the structure during the simulated isotropic compression; model interactions between particles and envelope spheres; and compute a probability distribution of normal and tangential contact forces from the interactions.

BRIEF DESCRIPTION OF DRAWINGS

FIG. 1A shows an example unit particle of the structure. FIG. 1B shows an example of interlocked unit particles. FIG. 1C shows a sheet of interlocked unit particles, forming an embodiment of the structure.

FIG. 4A shows an example of a unit particle and its digital model. FIG. 4B shows graphical representations of the digital model to particle surface. FIG. 4C shows an initial configuration of an enveloped unit particles (in this case, spheres) with topological interlocking.

FIG. 8 shows a table of parameters for different example unit particle geometries.

FIG. 12 shows an example table of Poisson's ration for different geometries of particles at different confining pressures.

DETAILED DESCRIPTION

Methods and systems described herein produce and utilize a structure that has dynamically tunable stiffness based on an applied pressure.

As used herein, a "unit particle" (or "particle") refers to the smallest rigid body in a structure. The term "truss" (or "beam") refers to a part of the particle that extends between nodes of the particle, the nodes being junctions between trusses. The term "loop" refers to a closed circumference of trusses on a particle (or closed enough to prevent a truss from another particle from passing through any gap in the loop's circumference).

The term "interlocking" refers to two or more particles having intertwined geometries such that they cannot be completely separated from each other (e.g., a truss of one particle goes through a loop of another particle).

The term "sheet" refers to a 2-dimensional extension of interlocked particles.

The term "structure" refers to a combination of interlocked particles forming a material to have tunable stiffness. A structure is in a "flexible mode" when it is tuned for low stiffness whereas when it is tuned for high stiffness it is in a "rigid mode". The terms "flexible" and "rigid" are not necessarily absolute (e.g., the rigid mode might still have some flexibility to it), just that there is a noticeable difference in the stiffness between the two modes.

The term "digital twin" refers to a computer model of a physical object. A "model" refers to a mathematical/data representation.

The term "three-point bending test" refers to a flexural test used to find values for, among other things, the modulus of elasticity in bending of an object, where either 1) two end points are supported at points a given distance apart and an increasing load is applied half-way between the points or 2) an object is supported at a center point, and two equal loads are applied at opposite ends equidistant from the center. In either case, the loads are controllable and the values are calculated based on the performance of the object under different loads.

The Unit Particle

Figure 1A:
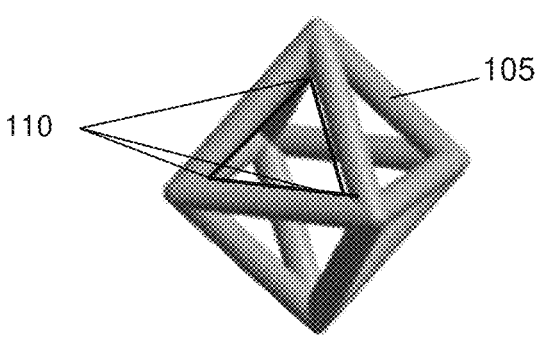
FIGS. 1A-1C show an example configuration of the structure.

The structure is composed of unit particles having lattice-like (hollow) geometries, in that they are two- or three-dimensional rigid bodies that form one or more "loops" in their body. An example is shown in FIG. 1A, with an octahedron shape for this example. The rigid trusses (105) make up the shape, with triangular "loops" (110) between three connected trusses. Other geometries (cubes, pentagonal trapezohedrons, circles, spheres, etc.) are also possible, including irregular geometric shapes, so long as they contain at least one "loop". The trusses can be straight or curved or bent or irregular. The number of "loops" for a given geometric shape can vary, depending on how many trusses are used to make the shape.

Interlocked Unit Particles

Figure 1B:
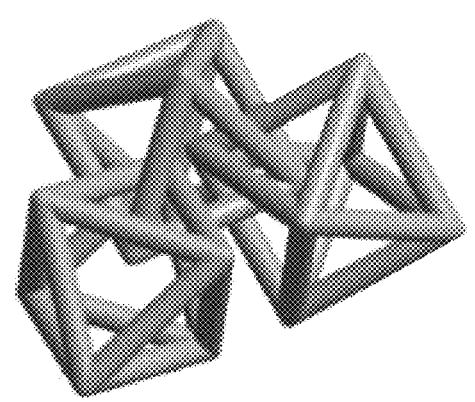

The purpose of the "loops" in the unit particles is to allow the unit particles to interlock with one another, as shown in the example of FIG. 1B. The interlocking of the unit particles allows the combined unit particles to jam together under applied pressure, while remaining pliable when pressure is not applied.

Jamming is a phase transition that does not rely on temperature changes, like in ordinary materials, but it is instead controlled by local geometric constraints in granular matter. The jamming transition enables granular systems to switch reversibly between deforming with fluid-like plasticity or with solid-like rigidity, with a change of packing fraction.

Structures

Figure 1C:
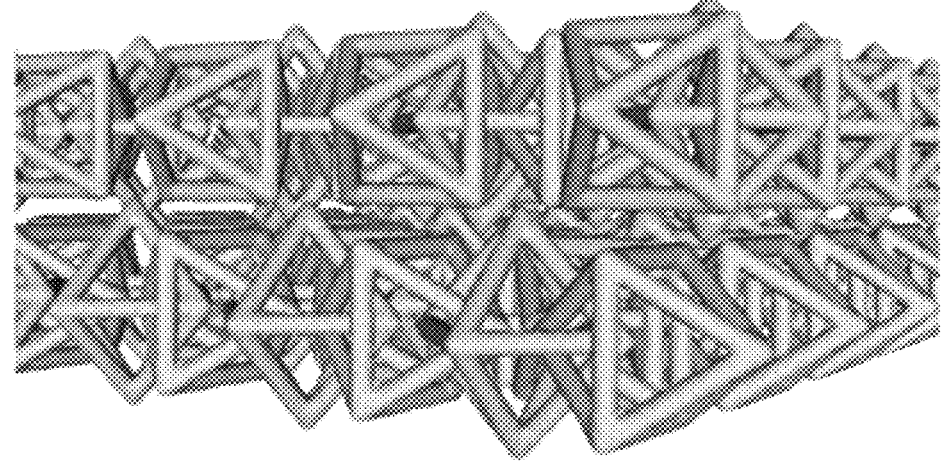
Figure 2:
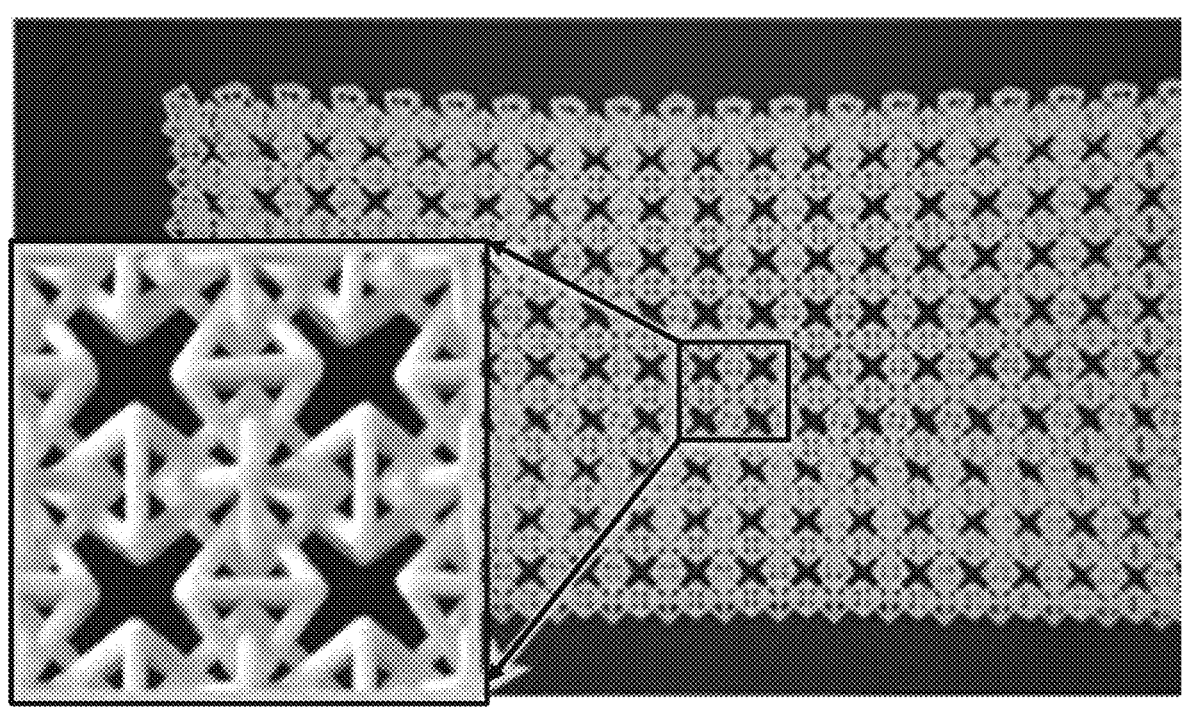
FIG. 2 shows a top view of an example structure sheet, with a blowup portion.

These interlocked unit particles can be formed into structures, such as sheets, as shown by example in FIG. 1C. FIG. 1C shows two sheets of interlocked particles one on top of the other, forming a two-sheet structure. In this example, the sheets are not interlocked with each other, in order to maximize the flexibility of the structure in the non-rigid state, but for some applications there can be interlocking between the sheets as well. FIG. 2 shows a single sheet structure from the top, with a blow up of a portion of the sheet to show more detail. The sheet shown in FIG. 2 is in a flexible mode, as evidenced by the maximal spacing between the particles.

Figure 3:
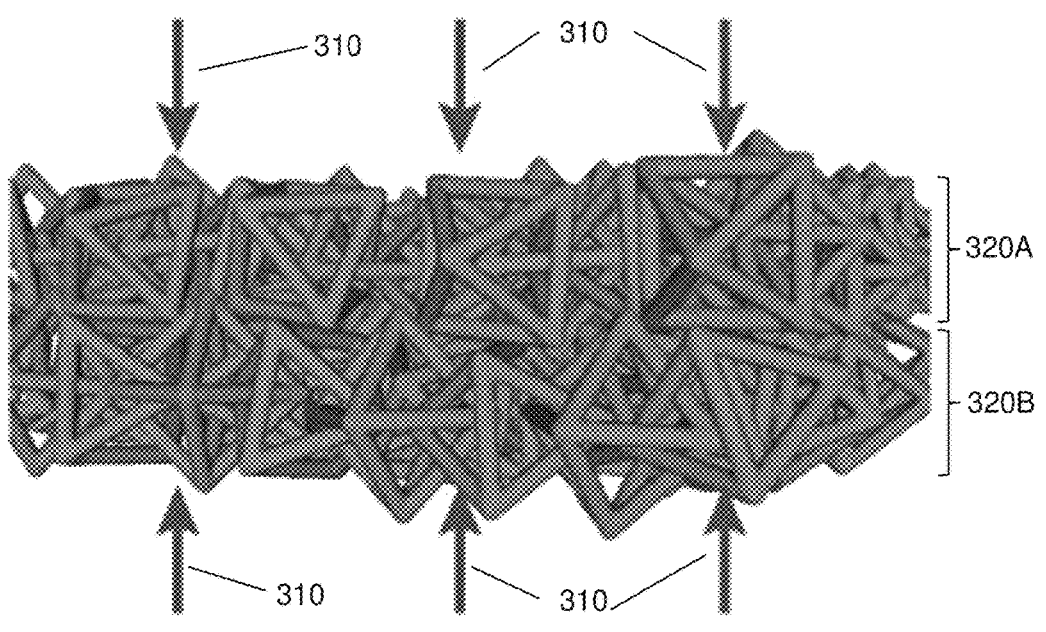
FIG. 3 shows an example structure made from two sheets under external pressure.

FIG. 3 shows a side view of a two-sheet structure when it is in a rigid mode. The applied pressure (310) causes the particles of the sheets (320A, 320B) to jam, increasing the stiffness (bending modulus) of the structure as a whole.

With even a small external pressure (e.g., ~93 kPa), the sheets become much stiffer (e.g., 25+ times more) than they are in their relaxed (flexible) configuration. This dramatic increase in bending resistance arises because the interlocking particles have a high tensile resistance, unlike what is found for loose granular media.

Designing Structures and Digital Representations

Discrete-element simulations (see e.g., US Patent Appl. Publ. 2018/0203960, incorporated in its entirety by reference herein) to relate the structure's micro-structure to macroscale properties and to interpret the experimental measurements. It is found that structures made of different nonconvex interlocked particles undergo a jamming phase transition that is described by a characteristic power-law function akin to the behavior of conventional granular media.

A particular structure (e.g., which particle geometries are used, interlocking pattern, use of sheets, etc.) can be tested physically by performing bending tests and measuring the modulus of bending for different applied pressures on the structure.

To quantify the change in mechanical properties as a function of increasing confining pressure, one can perform three-point bending tests and calculate the apparent elastic bending modulus of the structures. In these experiments, the samples can be supported at two edges, and a line-shaped indenter applied to the center of the top. Some measured force displacement curves (displacement controlled) can show an initially linear regime, at small indentation depths, governed by the elastic behavior of the jammed granular structure.

As indentation increases, a nonlinear response is observed, likely due to frictional sliding and local rearrangement of the particles. Although the structures are discrete and strongly anisotropic, one can use an apparent elastic bending modulus E*as a parameter to compare the structures' mechanical property under different conditions. E* can be calculated as:

$$E^* = KL^3/(4bh^3) \qquad \text{equation (1)}$$

Here, K is the stiffness of the initial elastic regime from the three-point bending test, L, b and h are the length, width and height respectively of the structure before the three-point loading tests. As the internal confining pressure increases the apparent bending modulus increases monotonically, by a large margin (e.g., over 25 times). The plateau reached by the apparent bending modulus at high confining pressures depends on the experimental setup (e.g., choice of structure, choice of envelope, etc.). Different confinement solutions may allow for reaching higher bending moduli. The jamming effect is largely controlled by contact topology. Compared to other variable-modulus materials, like shape memory alloys, magnetorheological materials, or electroactive polymers, these structures have the advantage of achieving high modulus tunability without the need for applying large temperature changes or high electrical/magnetic fields, which may be undesirable for some applications, such as wearable fabrics.

EXMPLE: A nylon plastic structured structure is 3D printed via selective laser sintering (SLS). The material used to print the fabric is PA 2200 nylon plastic, with density of 0.93 g/cm3, tensile modulus of 1.7 GPa and tensile strength 48 MPa. The equivalent density of the printed fabric is ~0.18 g/cm3, which is lower than most wearable materials. The flexile envelop is made of Polyethylene Plastic film (Mc- Master-Carr) with thickness of hm=0.076 mm and elastic modulus $E_m \approx 0.3$ GPa. The membrane's contribution to the measured apparent bending moduli, E*, should be no greater than the E* measured at near zero confining pressure (~1 MPa). At higher confining pressures, the membrane forms wrinkles that significantly reduce the overall tensile resistance and its contribution to the overall bending moduli. Because of the presence of wrinkles, neglect the membrane's contribution at higher confining pressures in the analysis. The aluminum structures are printed on a metal 3D printer (EOS M 290) with customized break-away supports. The material used for printing was EOS Aluminum AlSi10Mg. The bending stiffness of the fabrics enclosed within air-tight envelopes, at different confining pressures, is characterized with 3-point bending tests. The membrane envelope is first placed around the structure and the opening is sealed using a heat sealer. A soft tube connects from inside the envelope to a manual vacuum pump with pressure gauge. Different vacuum pressures are applied using the pump and the envelope is then sealed for testing. The membrane naturally wrinkles when vacuum is applied to conform to the fabric surface, which largely reduces its resistance upon stretching. The supports of the bending test have a width of 10 mm. Use an Instron E3000 materials tester, displacement controlled at a loading rate of 0.5 mm/s. 5 separate tests are repeated at each confining pressure. Before each test, the structure is manually reset to a flat initial configuration. Any deviation observed between the results from different tests at the same pressure arises from the initial configurations of the layers, which have different random initial contacts between the two layers (sheets). In the impact tests, the sheets are suspended between two metal supports at the edges and impacted using a stainless-steel sphere of mass m=30 g. The impact velocity, $v_0$=3 m/s, is set by the sphere's initial drop height. The impact is recorded using a high-speed camera at a rate of 3000 frames/second, to track the position of the sphere during impact. The stiffness of the initial elastic regime in the 3-point bending measurement was obtained by linearly fitting the force-displacement curve at small indentation depths (0 to 0.5 mm). This small indentation corresponds to in-plane strain of <0.05%, which ensures the fabrics are deforming within elastic limit. The overall dimensions (L, h and b) of the fabrics in the envelope at different confining pressures are measured before the 3-point bending tests. The apparent bending modulus is computed according to Equation (1), using the measured dimensions and stiffness (slope) of the elastic regime.

The particular structure can also be tested in simulation.

Simulation

Step 1: Construct a Model of the Structure.

First construct a "digital twin" (with the same shape, size and density) of the particles originally selected to be fabricated (e.g., octahedrons). A single "digital twin" is represented by two sets of points that allow for contact computations between two particles. The first set of points (termed as "nodes" hereafter) together with their triangulations (see e.g., the righthand side image in FIG. 4A) characterize the shape of the particle in a discretized manner. The points in the second set (termed as "grids" hereafter) are equally spaced in space along all three directions (x, y and z), and each grid point stores a signed scalar value (positive if outside the hollow octahedron's surface, zero if on and negative if inside) indicating its shortest distance to the triangulated surface formed by the nodes.

Figure 4A:
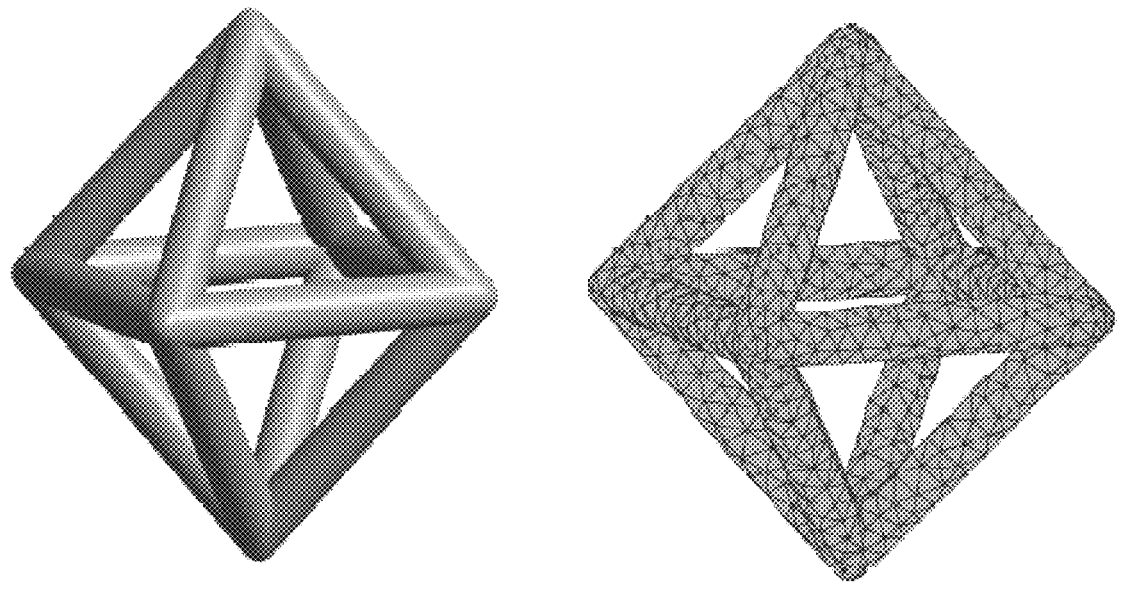
FIGS. 4A-4C show an example of digitally modelling the structure.
Figure 4B:
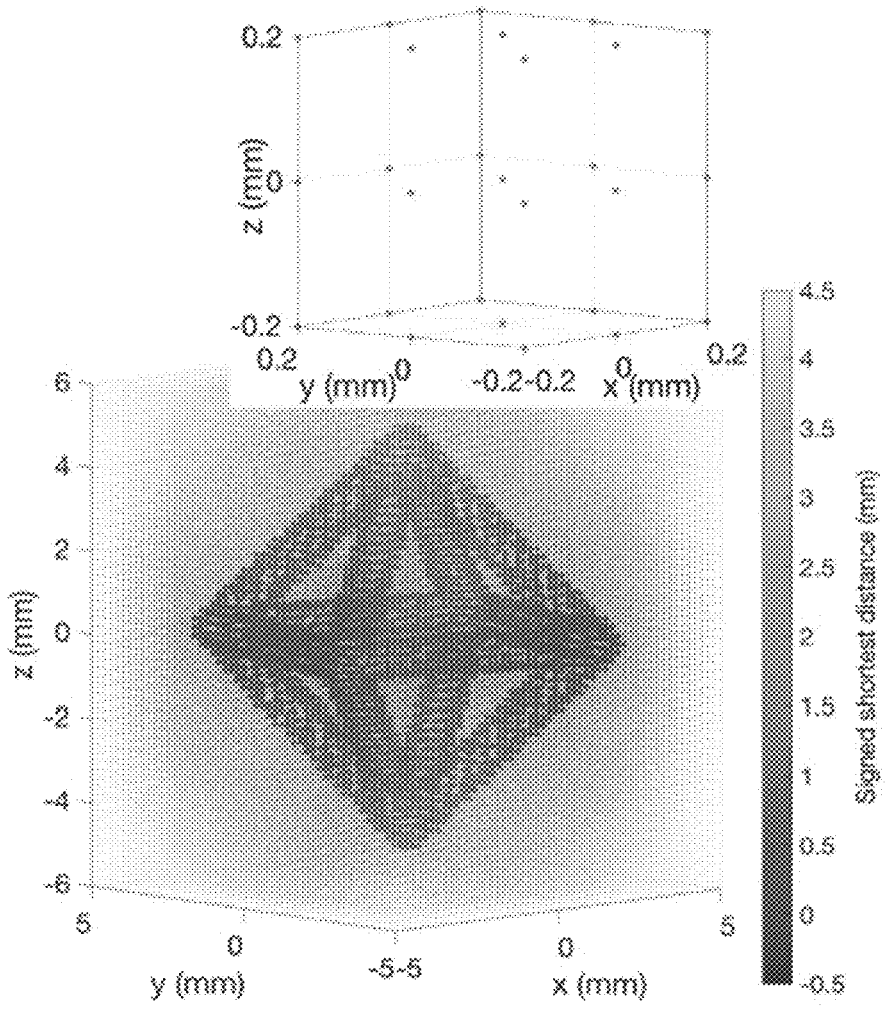

FIG. 4B shows an example of corresponding "grids" of the constructed "digital twin" with shading indicating the signed shortest distance to the particle surface of FIG. 4A (darker shading indicating shorter distance).

Accordingly, these grid points together with their stored values form a discretized level set representation for the hollow octahedron. The grid points whose shortest distances to the particle's surface is less than 0.01 mm reproduce reasonably well the geometry of the particle.

After constructing the "digital twins" of all particles, they can be used to detect contacts and compute contact forces. Following the standard penalization formulation adopted in the Discrete Element Method (DEM): A contact between two hollow octahedrons happens if at least one node point of one particle (the "primary") penetrates into the surface of the other (the "secondary"). This is achieved by computing the signed shortest distance of each node point of the primary using the grid points (which store a discretized level set function) of the secondary and selecting node points of the primary with negative distances to the secondary (i.e., inside the secondary). These negative distances are penalized following a linear Hookean model to generate the contact forces at each selected node point. Summing the contact forces induced at all selected node points of the primary gets the total contact force between the primary and the secondary. The total contact force is used to update the kinematics of each particle following Newtonian mechanics. For a detailed discussion on the relevant formulation and implementation, refer to Kawamoto, R., Andò, E., Viggiani, G., Andrade, J. E. *All you need is shape: predicting shear banding in sand with LS-DEM.* J. Mech. Phys. Solids 111, 375-392 (2018).

Since all contact forces induced at all of the node points that are in contact are summed directly, it is important to match the resolution of both nodes and grids for different particle geometries, in order to ensure consistent and comparable simulation results of different structures.

When creating a "digital twin" of the hollow octahedrons with a certain node and grid resolution, the node resolution can be chosen such that the constructed "digital twin" can reasonably capture the major features of the actual geometry of the particle. Next, create the digital twins of all other considered particle geometries with the respective node resolution matching that of the "digital twin" of the originally selected particle. Specifically, match the probability distribution of the triangulation's edge lengths of each particle's digital twin to that of the constructed digital twin of the originally selected particle. In some embodiments, use a finite-element mesh generator (e.g., Gmsh) to create the "nodes" component of a digital twin and match the node resolution as described above. Once the node resolution is matched, the number of nodes discretizing each particle scales reasonably well with the total surface area of the respective particle. This implies a consistent level of spatial discretization homogeneity between different generated "digital twins". The grid resolution can be chosen to be able to resolve the interior and exterior of the hollow octahedron (e.g., an inter-grid distance of 0.2 mm in all three directions to resolve the truss members' thickness which is 1 mm). Taking the generated "nodes" component of a digital twin, set the grid resolution for all digital twins to be 0.2 mm and generate the "grids" component of the digital twin. These two components can then be merged into a single file, which can be used as an input for LS-DEM simulations.

Choose the dimensions of all other considered particle geometries such that, when two produced sheets are stacked vertically, they can be enclosed tightly by the constructed envelope (to simulate the applied pressure). As a consequence, they share, on average, the same total dimension (height, width and length) with that of the sheets composed of the particles after isotropic compression. The results of 3-point bending tests can be sensitive to the geometry and size of the specimen, therefore maintaining overall the same dimensions for different sheets is useful.

The initial configuration of each produced sheet should be free of inter-particle contacts. To satisfy these two requirements, only adjust the particle size while maintaining the same truss members' thickness (e.g., 1 mm) for all particle geometries except for the circular and the rectangular rings. For these two geometries, besides adjusting the particle sizes, further increase the truss members' thickness (e.g., to 3.6 mm for the circular ring and 2.7 mm for the rectangular ring).

The pressure (P) can be calculated by the following formula:

$$P = \frac{mg}{A} \qquad \text{equation (2)}$$

Where m is the mass of the sheet, g is the acceleration due to gravity, and A is the area of the sheet. The mass of each sheet is measured in experiment. For example, a suppose the mass is 27 g. When considering gravity and a 21 cm by 9.2 cm sheet, this corresponds, for this example, to an equivalent pressure of:

$$\frac{0.027 \text{ kg} \times 9.81 \text{ m/s}^2}{0.21 \text{ m} \times 0.092 \text{ m}} = 13.7 \text{ Pa}$$

Although this pressure could contribute to the bending modulus at zero, or very low, confining pressures, it can be neglected for confining pressures above 2 kPa. For simplicity, the effect of gravity can be ignored. All particles share the same density equaling the density of the material used in the particles. Once the "digital twin" is created for each of the considered particle geometries, replicate and arrange in space these "digital twins", to construct numerically the corresponding sheets.

Lastly, in order to simplify the calibration process (see "Step 7: Determine model parameters", for relevant discussions), scale the density of every envelope sphere such that they all share the same mass with the originally selected particle.

Step 2: Construct an Envelope Model.

Figure 4C:
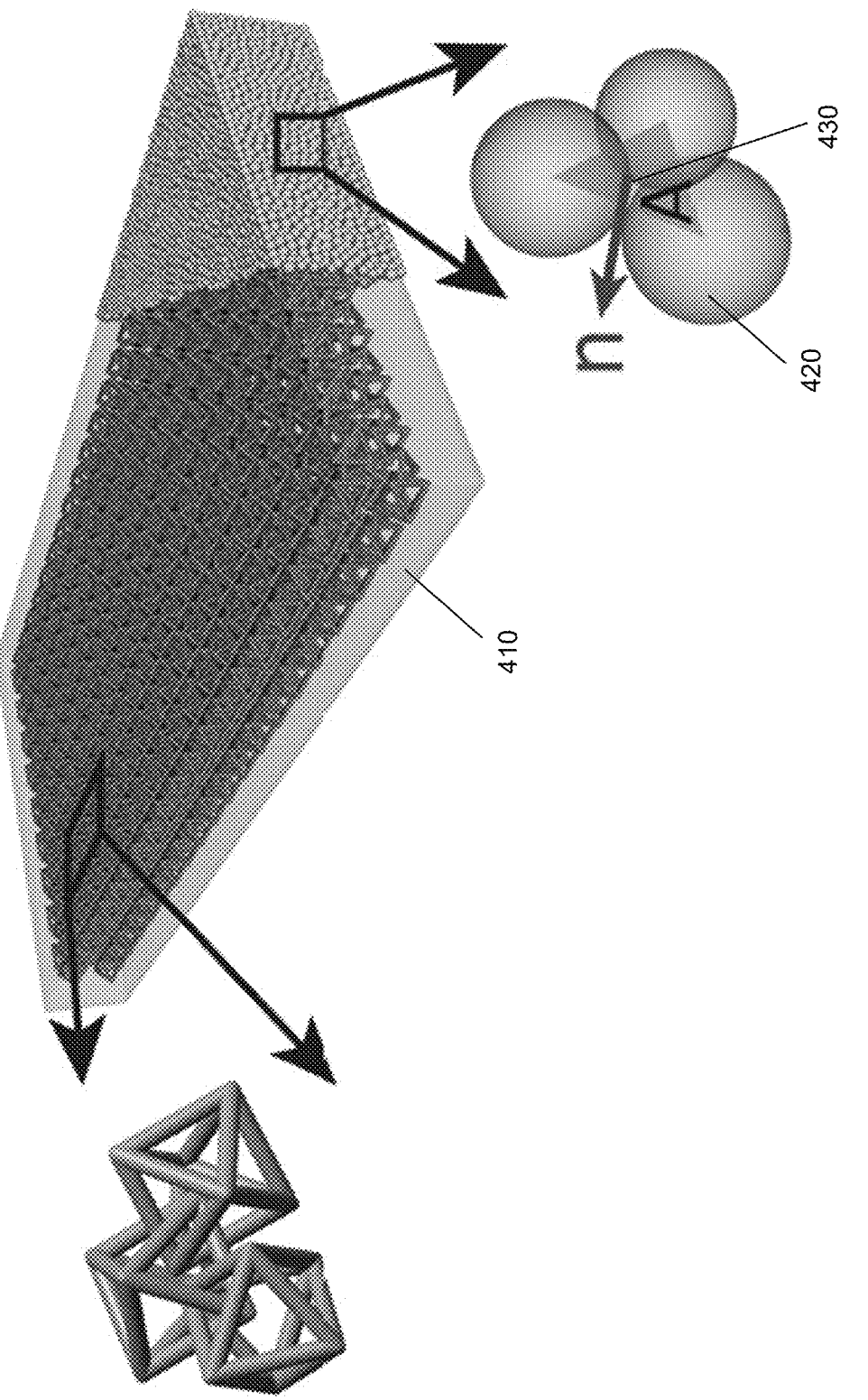

In examples within the small strain limit described above, the envelope remains wrinkled and conforms to the particles' surfaces. As such, assume that the membrane only acts as a compliant layer that applies the confining pressure, without contributing to the structure's overall bending stiffness. Based on this assumption, construct a simplified envelope model that only serves as a compliant elastic layer to transmit the imposed confining pressure to the structure. In some embodiments, construct an envelope (410) with an initially rectangular-box shape, to enclose the structure (see FIG. 4C). Triangulate the surface of the envelope and assign a sphere (420) at each node and a connection (e.g., a normal and a shear spring) at each edge between two neighboring spheres. Consequently, each sphere is connected to six neighboring spheres. The resting length of each spring is given by the corresponding initial edge length, while the radius of each sphere is given by the average initial length of the six edges in connection with the sphere. The radius of each sphere is thus different but resides in a range (e.g., 0.9 mm-1.3 mm). Similarly, the node resolution of the envelope is adjustable, and a resolution can be selected balancing the tradeoff between representation accuracy and computational expense. Again, once a resolution is determined, use the constructed envelope in all of the simulations for consistency.

For the simulations of non-interlocked, hollow particles (for comparison to the interlocked case), construct a slightly higher envelope, to enclose loose particles that are initially positioned into, for example, multiple layers with no mutual contacts or links. This choice is made to ensure that at the jammed state, the loose particles' samples share approximately the same dimension (height, width and length) with the stacked interlocked sheets simulation (see e.g., Table. 1).

TABLE 1

| | Example dimensions (approximate) computed from separate simulations. | | | | | |
|---|---|---|---|---|---|---|
| Confining | Length L (mm) | | Width b (mm) | | Height h (mm) | |
| Pressure P (kPa) | Interlocked | Non-Interlocked | Interlocked | Non-Interlocked | Interlocked | Non-Interlocked |
| 93 | 209.87 | 204.39 | 92.34 | 98.41 | 16.11 | 16.95 |
| 79 | 210.03 | 203.68 | 92.06 | 97.40 | 16.18 | 16.94 |
| 53 | 210.25 | 201.52 | 91.66 | 96.39 | 16.23 | 16.91 |
| 40 | 209.77 | 202.15 | 91.48 | 95.86 | 16.22 | 16.71 |
| 13 | 211.03 | 201.97 | 92.38 | 94.54 | 16.42 | 16.88 |
| 2 | 208.38 | — | 95.76 | — | 16.66 | — |

Keeping the same dimensions for all simulations ensures that the results from the simulated three-point bending tests are directly comparable to one another. In order to use the same model parameters for these two different envelopes, choose a node resolution for the new envelope such that the statistical distribution of the envelope sphere's radius matches that of the original envelope.

Step 3: Simulate isotropic compression

A given confining pressure P is applied to the structures by going through each triangle i of the envelope, computing its area $A_i$ and inward surface normal $n_i$, calculating the total force $PA_i \cdot n_i$ and distributing equally to each of the three connecting envelope spheres (430). Iterate the above procedure allowing the whole system to relax to equilibrium. Note that at each iteration the values of $A_i$ and $n_i$ are updated following the envelope's deformation. Monitor the total kinetic energy and total contact number of all particles at each time step and deem equilibrium to be achieved if both the total kinetic energy and total contact number cease to show any preferred direction of evolution with time, notwithstanding certain small temporal fluctuations.

Step 4: Simulate 3-Point Bending under Compression

After the whole system equilibrates under isotropic compression as described above, perform three-point bending simulation by changing the boundary condition. In addition to maintaining the imposed isotropic compression, fix the dynamics of the particles along the two edges of the fabric to the bottom layer. Then impose a constant force pointing downward vertically (i.e., along the z direction) that is evenly distributed on particles along the center line of the fabric on the top layer. The value of the applied force can be chosen according to the experimental results, ensuring the simulated mechanical response is within the small strain limit (i.e., elastic regime). Then iterate the above procedure allowing the whole system to relax to equilibrium under the new boundary condition. The average vertical deflection (along the z direction) of the loaded particles can be monitored in time. Equilibrium is achieved if the average vertical deflection ceases to evolve with time. Once equilibrium is achieved, stop the simulation.

Step 5: Compute the Structure's Dimensions at the Jammed State

Define the jammed state in as the state of the structure right after the completion of the isotropic compression, before the three-point bending simulation. The height (along z direction), width (along y direction) and length (along x direction) of a given structure at the jammed state are computed as follows (taking height as the illustrative example): first identify and group particles belonging to the top and bottom sheets. Next, for each group, go through each particle within the group, identifying the nodal point with the largest (for top sheet group) or smallest (for bottom sheet group) value along the z direction, and averaging along the z direction all identified nodal points for both the top sheet group and bottom sheet group. Lastly, compute the height as the difference between these two averaged values. For examples of results of apparent bending modulus, corresponding height, width, and length of both interlocked fabrics and loose assemblies see Table 1.

Step 6: Model the Interactions between Particles and Envelope Spheres

To describe the model parameters, this example uses a subscript notation as follows: use "n" ("t") to represent the normal (tangential) direction for a contact, "p" to represent the particle (e.g., a hollow octahedron), "s" to represent the envelope sphere, and "−" to represent the interaction. For example, $k_{n,p-p}$ means the normal ("n") contact stiffness ("k") between two particles ("p–p"), and $y_{n,p-s}$ means the normal ("n") contact damping ("$\gamma$") between a particle and an envelope sphere ("p–s"). Interactions between particles are modeled as being linear Hookean, with Coulomb friction. Associated model parameters are the contact normal (tangential) stiffness $k_{n,p-p}(k_{t,p-p})$, the contact normal (tangential) viscous damping $\gamma_{n,p-p}$ ($\gamma_{t,p-p}$) and the friction coefficient $\mu_{p-p}$ The viscous damping can be determined from the respective coefficient of restitution $e_{n,p-p}$ ($e_{t,p-p}$) following $\gamma_{n,p-p}=-\ln(e_{n,p-p})\sqrt{m_p k_{n,p-p}}/\sqrt{\pi^2+\ln^2 e_{n,p-p}}$ ($\gamma_{t,p-p}$ be computed analogously using $e_{t,p-p}$). Here $m_p$ is the mass of a single hollow octahedron. The value of a coefficient of restitution resides between 0 and 1, with 0 indicating perfectly plastic binary collision and 1 indicating perfectly elastic binary collision. Interactions between particles and envelope spheres are also modeled as being linear Hookean, but without any friction. This frictionless assumption is a reasonable approximation since the envelope used in this example is compliant enough to conform to the surface of the particles upon isotropic compression. Associated model parameters are contact normal stiffness $k_{n,p-p}$ and contact normal viscous damping $y_{n,p-p}$ (where $y_{n,p-s}$ can be determined from $e_{n,p-s}$). Lastly, for the interactions between envelope spheres, each envelope sphere only interacts with its six nearest neighbors via the connecting normal and shear spring. Since the envelope used in the experiments is very compliant to shear and compression but resistive to tension, three parameters can be used to describe the behavior of the spring: normal compressive stiffness $k_{n,compressive}$, normal tensile stiffness $k_{n,tensile}$, and tangential stiffness $k_t$. Note that overlap between envelope spheres may occur due to envelope contraction, but such interactions are not penalized. The introduction of all viscous damping parameters ($\gamma_n$ and $\gamma_t$) along the normal and tangential springs serves as regularization, used for numerical convenience. From a physical standpoint, the damping parameters can be interpreted as to account for the unavoidable experimental dissipation that occurs both within the material itself (deformation of the envelope) and during the interactions between different objects (between the envelope and the particles and between particles themselves).

Step 7: Determine the Model Parameters

In this example there are a total of 5 (between particles)+2 (between particles and envelope spheres)+5 (between envelope spheres)=12 model parameters whose values are in need of determination. For the ease of parameter calibration, further enforce several constraints in advance to reduce the dimension of calibration. These constraints are based on a combination considering common DEM practice, physical arguments and computational expenses.

First, since the effect of gravity is negligible and, accordingly, all spheres are scaled to share the same mass with the selected particle, set $k_{n,p-s}=k_{n,p-p}$ and $\gamma_{n,p-s}=\gamma_{n,p-p}$. The choice of setting $k_{n,p-s}=k_{n,p-p}$ also prevents excessive penetrations between the envelope and the fabric particles, avoiding unphysical long-range contacts between chain mail particles and distant envelope spheres.

Second, we set $k_{t,p-p}=\alpha k_{t,p-p}$, with $\alpha$ being a weighting value between 0 and 1. It has been shown that for modeling flow of rigid spheres, the steady state dynamical response (e.g., velocity profile and packing fraction) is not sensitive to the specific value of $\alpha$ and to the coefficient of restitution for various tested strain rates, provided a rigid limit is ensured (if $k_n$ is large enough). A smaller value of the coefficient of restitution mainly reduces the time needed to reach steady state, by dissipating kinetic energy more quickly, thereby reducing the number of time steps needed. To focus on the equilibrated states (i.e., equilibrated state of isotropic compression and that of the three-point bending loading) common DEM practice sets, for this example:

$$a=\tfrac{2}{3}, e_{n,p-p}=e_{n,p-s}=0.1, e_{t,p-p}=1(\gamma_{t,p-p}0), e_n=0.1, \text{ and}$$
$$e_t=1(\gamma_t=0).$$

Lastly since the envelope is very compliant for both compression and shear, assume $k_{n,compressive}=k_t$.

With these pre-enforced constraints, the number of parameters in need of calibration reduces to four: $k_{n,p-p}$, $\mu_{p-p}$, $k_{n,compressive}$ and $k_{n,tensile}$. One additional parameter is the time step $\Delta t$. Select $\Delta t$ to be a small fraction of the characteristic binary collision time:

$$t_c = \pi \left( \frac{2k_{n,p-p}}{m_p} - \frac{\gamma_{n,p-p}^2}{4} \right)^{-\frac{1}{2}}. \qquad \text{equation (3)}$$

As larger contact stiffness leads to smaller time steps, and thus leads to an increase of time steps required to achieve equilibrium, do not use the true mechanical property of the material to determine the value for $k_{n,p-p}$, but rather select a value that is large enough to ensure rigid limit, such that the physical results at equilibrated states are no longer affected by the particular value of $k_{n,p-p}$. Choose a value for $k_{n,p-p}$ such that the contact penetration does not exceed a threshold (e.g., 1%) of the truss members' thickness (e.g., 0.01 mm). Since the envelope is modeled as a collection of interacting spheres, values for $k_{n,compressive}$ and $k_{n,tensile}$ must be determined together with the value of $k_{n,p-p}$, so that the model as a whole can capture the results. In some embodiments, use the experimentally obtained apparent bending modulus value at the highest confining pressure (e.g., 93 kPa) to calibrate the model. Specifically, the values of $k_{n,p-p}$, $k_{n,compressive}$ and $k_{n,tensile}$ can be determined by matching the simulated apparent bending modulus and experimental results at P=93 kPa (P being the confining pressure). With these parameters being determined, further employ a global damping ratio β (e.g., 0.001) to facilitate the relaxation process. (The corresponding implemented global damping $\xi=\beta\sqrt{k_{n,p-p}/m_p}$). Lastly, set $\mu_{p-p}$=0.25, a value determined by calibrating and validating compression experiments on 3D-printed spheres.

Figure 10:
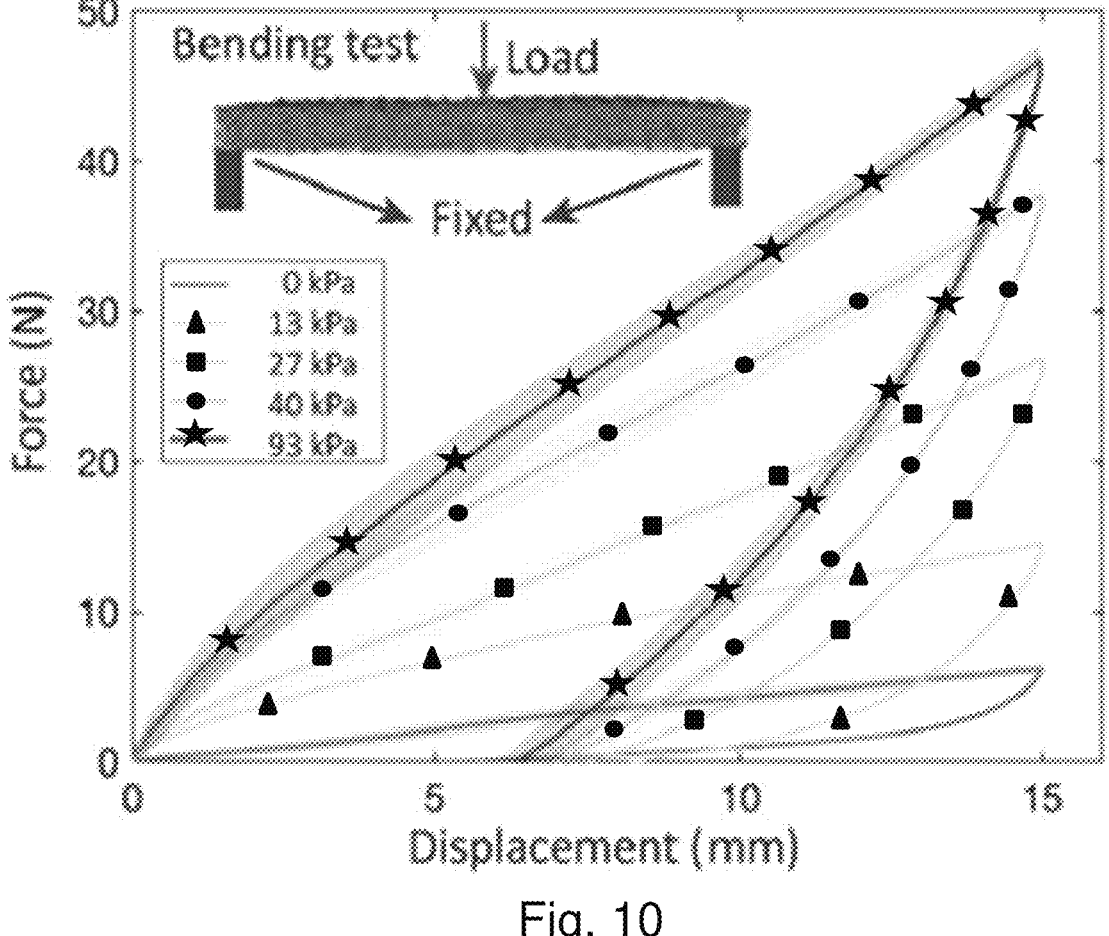
FIG. 10 shows an example graph of force vs. displacement for a structure under different applied confining pressures.

The calibrated values for all model parameters (see e.g., Table 2), once determined, remain unchanged throughout. Simulation results show that a calibrated model is robust against different confining pressures and different initial configuration of the particles (see e.g., FIG. 10) and give physical representation of the shape of the deformed envelope (see e.g., FIG. 5A). The values of the parameters are not unique in terms of capturing the experimental results: they depend on the specific calibration process.

TABLE 2

Example values of model parameters.

| Model Parameter | Value |
| --- | --- |
| $k_{n,p-p}(k_{t,p-p} = 2/7k_{n,p-p})[kg/s^2]$ | $9.7 \times 10^4$ |
| $k_{n,p-s}(k_{t,p-p} = 2/7k_{n,p-s})[kg/s^2]$ | $9.7 \times 10^4$ |
| $e_{n,p-p}(e_{n,p-s}, e_n = e_{n,p-p})$ | 0.1 |
| $e_{t,p-p}(e_{t,p-s}, e_t = e_{t,p-p})$ | 1.0 |
| $\beta\ (\xi = \beta\ \sqrt{k_{n,p-p}/m_p})$ | 0.001 |
| $\Delta t[s]$ | $4.66 \times 10^{-7}$ |
| $\mu_{p-p}$ | 0.25 |
| $k_{n,compression}(k_t = k_{n,compression})[kg/s^2]$ | 50 |
| $k_{n,tensile}\ [kg/s^2]$ | 800 |

Figure 5A:
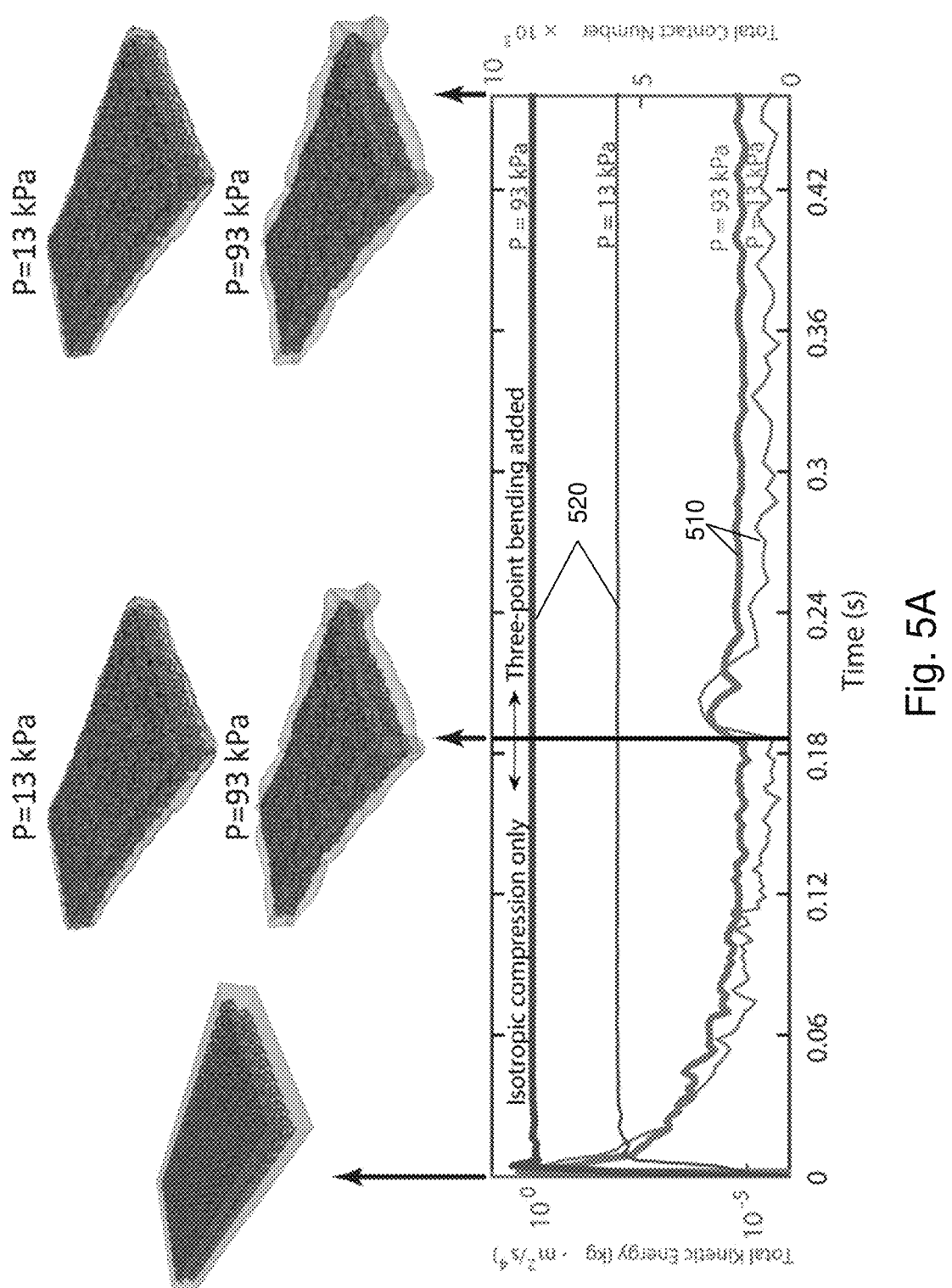
FIGS. 5A-5C show example graphs of bending test simulations.
Figure 5B:
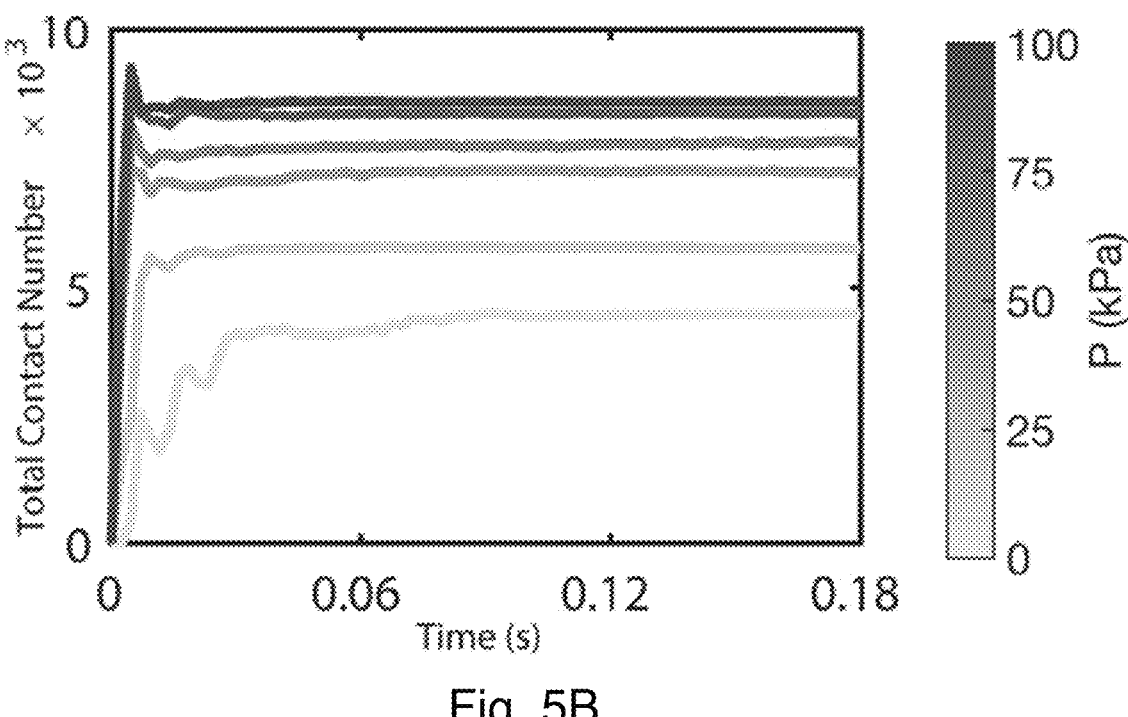
Figure 5C:
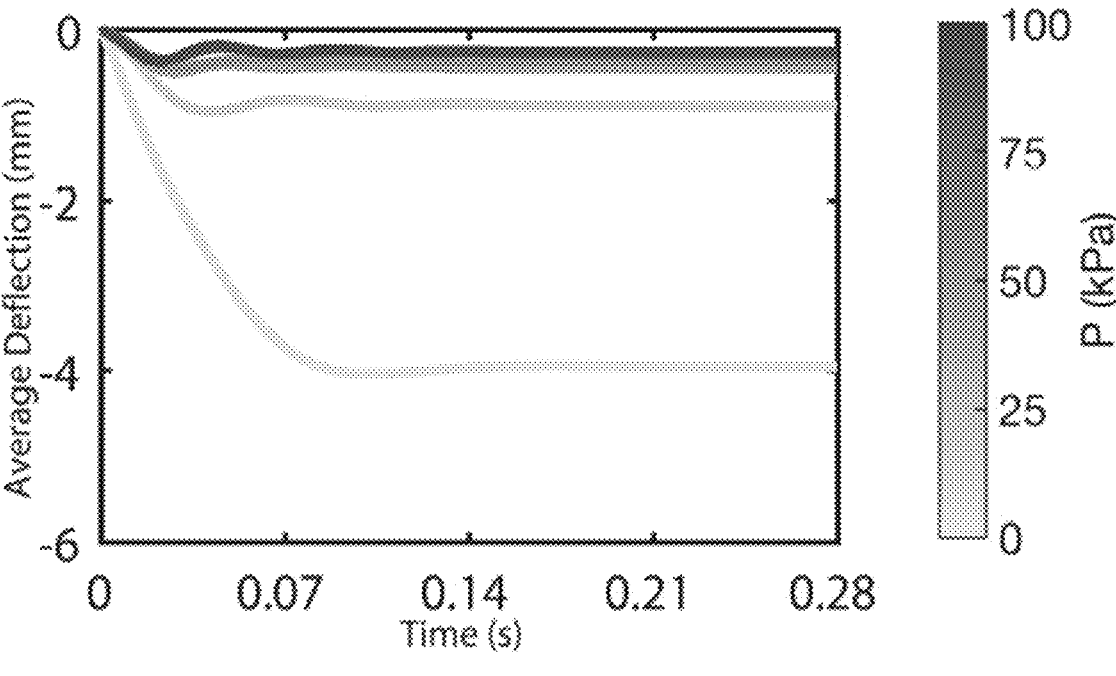
Figure 6A:
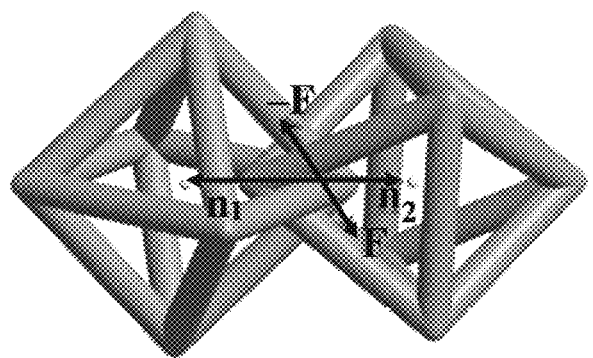
FIGS. 6A-6D show example contact force vectors for different binding situations.
Figure 6B:
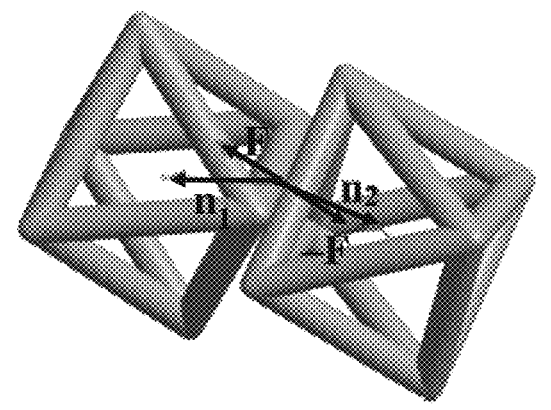
Figure 6C:
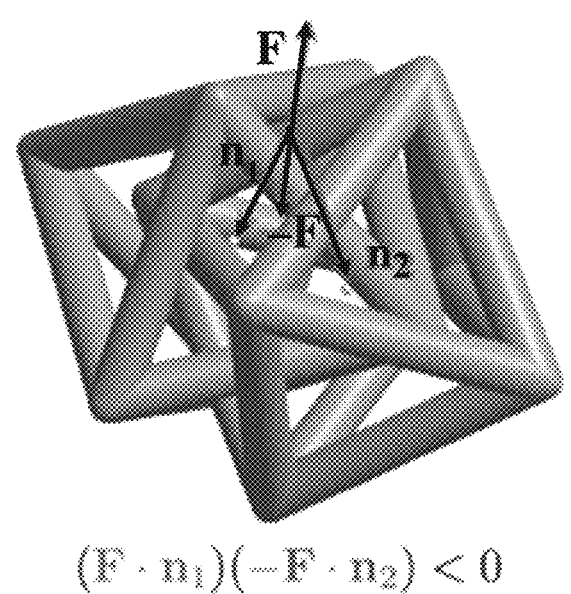
Figure 6D:
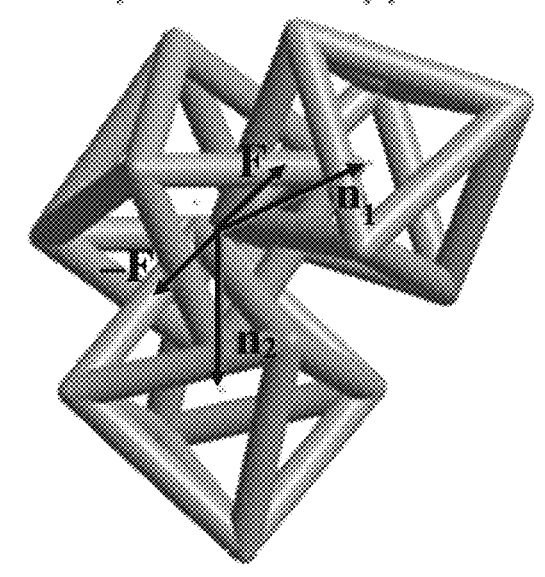

FIGS. 5B and 5C show example graphs of the evolution of the total contact number for the same sheet during an "isotropic compression only" simulation (FIG. 5B) and the evolution of the average deflection of loaded particles during a "three-point bending added" simulation stage for the same six different applied confining pressures (FIG. 5C).

FIGS. 6A-6D show four examples (one tensile and three compressive) of force vectors for interlocked particles. In each of the subfigures, F is the total contact force vector while $n_1$ and $n_2$ are vectors pointing from the contact position to the respective centroid location of each contact particle.

Step 8: Compute the Probability Distribution of Normal and Tangential Contact Forces The probability distribution functions are computed in their discretized form by partitioning the contact force magnitudes into bins with a uniform width, calculating the probability associated with each bin as the count of contact force in each bin divided by the total count of contact forces, and defining the force magnitude corresponding to each probability by the mid-point of each bin.

Step 9: Validate the Model with Other Particle Geometries

In order to ensure that the LS-DEM model generalizes beyond the originally selected particle unit cell, fabricate another structure consisting of interlocked particles constructed from other particle geometries and compare experimental results with simulation.

Step 10: Find the Power Law Fitting between E* and Z

Figure 11:
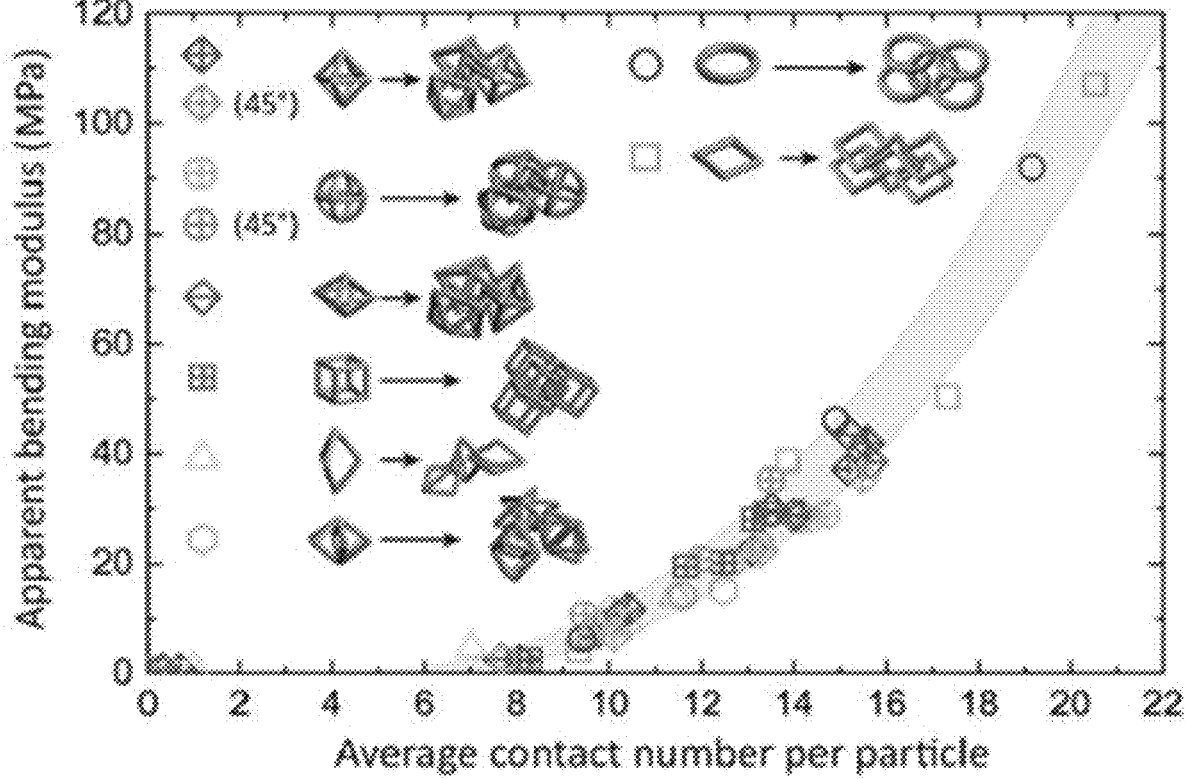
FIG. 11 shows an example graph of apparent bending modulus (stiffness) vs. the average contact number between the particles for different particle geometries.

To fit the relation between apparent bending modulus E* and average contact number per particle Z, adopt a power law function predicted by the critical phenomenon of jamming transition. The functional form is:

$$E^*=a(Z-Z_0)^b \qquad\qquad \text{equation (4)}$$

where a is a fitting coefficient, b is a scaling exponent, and $Z_0$ corresponds to the isostatic coordination number. Since $Z_0$ depends on the specific particle geometry, use different $Z_0$ values for different particle shapes while keeping a and b the same for the fitting. Example fitting parameters are shown in FIG. 8. Apparent bending modulus vs. the average contact number per particle for different particles is shown in FIG. 11. Due to the expensive computational cost of the LS-DEM simulation process, it can be difficult to obtain data with enough orders of magnitude to validate the power law scaling or to claim a power exponent.

Step 11: Simulate Uniaxial Tensile Tests of Structures under Confinement

Since the structures are highly anisotropic, their apparent tensile moduli can be tested along various directions at different confining pressures (e.g., lattice rotated 45°). In contrast to the apparent bending moduli, the tensile moduli extrapolate to non-zero values at zero pressure due to the resistance offered by the interlinking. For example, for octahedral particles and particles with three orthogonal rings, the tensile moduli along length and width directions are approximately the same, as these are symmetry axes. However, for cubic particles, since the symmetry axes do not fall along the structure's length or width, the tensile moduli along these two directions are different. Examples of Poisson's ratios measured in tensile tests for different geometries are shown in FIG. 12.

Step 12: Determine Poisson's ratio under bending (beam vs. plate assumption)

to evaluate the fabrics' Poisson's ratio under bending deformation, we analyzed the fabrics' curvature along length ($\kappa_L$) and width ($\kappa_W$) directions in LS-DEM simulation. For the example of octahedra structures at 13 kPa confining pressure, $\kappa_L$=3.2×10$^{-1}$m$^{-1}$ and $\kappa_W$−2.5×10$^{-2}$m$^{-1}$. The Poisson's ratio under bending is then calculated as:

$$v_{WL} = -\frac{\kappa_W}{\kappa_L} \qquad\qquad \text{equation (5)}$$

giving a value, for this example, of 0.078.

For a relatively small Poisson's ratio, the difference of apparent bending modulus (E*) calculated using the elastic beam model (Timoshenko beam theory) versus plate model (Kirchhoff-Love plate theory) will be (using the above example): $v_{WL}^2$=6×10$^{-3}$<1%.

In these cases (<1%), the elastic beam model can be adopted when calculating apparent bending modulus (1) for simplicity.

Applying Pressure to Tune Stiffness

The structures change their stiffness (bending modulus) under external pressure, with increasing stiffness with increased pressure, depending on the size and geometry of the particles and their interlocking.

A number of methods can be used to apply pressure on a structure to tune the stiffness. The means of applying pressure can include:

Placing the structure in an air-tight flexible enclosure (e.g., plastic envelope) and using a mechanism (e.g., vacuum) to control the fluid pressure (e.g., air pressure) within the enclosure. As the fluid pressure decreases, the deflating envelope applies increasing external pressure on the structure, increasing its stiffness.

The structure can be struck or pressed on by an external object with force, thereby applying external pressure on the structure. For example, a projectile hitting the structure, or a surface being pressed by or pressing on the structure.

The structure can have pressure applied by external actuators attached to plates on or straps crossing the structure. The actuators can be linear, rotary, hydraulic, pneumatic, electro-magnetic, electrostatic, piezoelectric, thermal, mechanical, supercoiled polymer, or the like.

The structure can have external bladders that fill with fluid to press on the structure.

The structure can be made of a magnetically reactive material and have a magnetic field applied.

The structure can be made from expandable materials, such as thermally expandable materials. The material expansion creates an effective pressure on the structure.

Any external pressure would, to some degree, increase the bending stiffness of the structure.

Figure 13A:
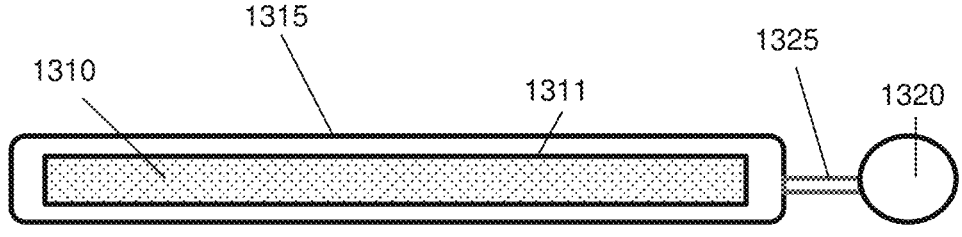
FIGS. 13A-13C show examples of systems for applying an external pressure to a structure.
Figure 13B:
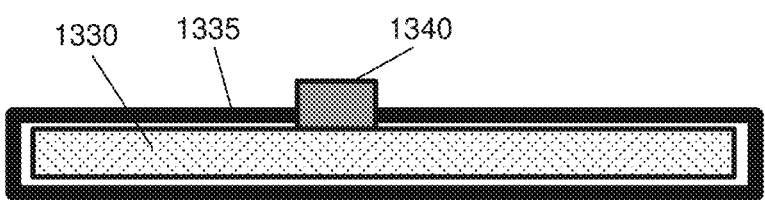
Figure 13C:
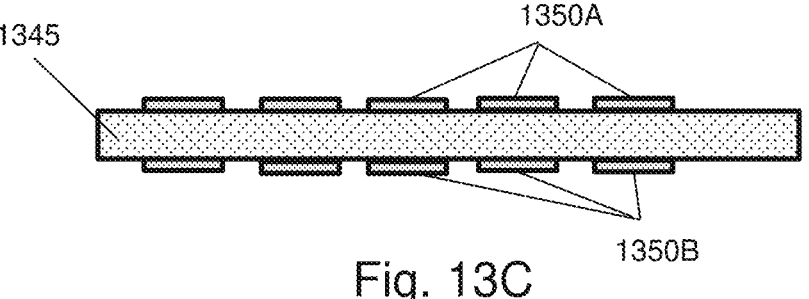

Examples of systems to apply external pressure are shown in FIGS. 13A-13C.

FIG. 13A shows an example of confining pressure by fluid manipulation. The structure (1310) is surrounded by a flexible envelope (1315) attached to a pump (1320), perhaps by a hose (1325) if the pump (1320) is to be remotely located. In a first embodiment, the pump (1320) deflates the envelope (1315) by removing a fluid (e.g., air), thereby creating pressure on the structure (1310) to stiffen it. In a second embodiment, the pump (1320) injects a fluid into the envelope (1315) to create the pressure. In this embodiment, the structure may need to be surrounded by a layer (1311) impermeable to the fluid in order to prevent the fluid from flowing through the structure's lattice rather than applying the needed pressure. Such a layer (1311) is not usually needed in the first embodiment but can be included. In both cases, reversing the action of the pump (1320) relieves the pressure and makes the structures (1310) flexible.

FIG. 13B shows an example of pressure by tightening straps. The structure (1330) is surrounded by flexible straps (1335). The straps (1335) are connected to an actuator (1340) that can loosen and tighten the straps (1335) as needed. When tightened, a pressure is applied to the structure (1330) causing it to stiffen. When loosened, the pressure is decreased, and the structure (1330) is made flexible.

FIG. 13C shows an example of pressure by electromagnetic force. The structure (1345) has patches (1350A, 1350B) that house electromagnets. In some embodiments, the patches are thin and flexible. When the patches (1350A, 1350B) are activated, one side's patches (1350A) are configured to create an attracting force with the other side's patches (1350B), thereby creating pressure and stiffening the structure (1345). Deactivating the patches (1350A, 13508)

relieves the pressure and returns the flexibility. In some embodiments, one of the sides has ferromagnetic material instead of electromagnets. The thickness of the structure will depend on the strength of the magnets and vice versa.

To understand the fundamental mechanisms leading to the increase in bending stiffness, the micro-structural interactions and displacements between particles can be tested using numerical simulations (see e.g., FIG. 5A, showing an evolution of total kinetic energy (510) and total contact number (520) of all constituent particles of a fabric sheet under two confining pressures: 13 kPa (upper panel) and 93 kPa (lower panel)). In a given range of confining pressure (e.g., up to 100 kPa), the constituent particles' elastic deformation can be much smaller than the particles' rigid body motion (e.g., rearrangement) and can be neglected. Modelling a sheet as a granular system can be done using, for example, the Level Set-Discrete Element Method (LS-DEM). LS-DEM can reveal the detailed micro-structures formed from particles of arbitrary shape. Modelling structures by constructing a "digital twin" of, for example, a hollow octahedral particle (see e.g., FIG. 4A), which is then replicated and rearranged to reproduce 3D-printed sheets. A flexible envelope used for applying confining pressure on the structure can be modelled as a discretized elastic layer. After calibration (see Simulation above), the model can capture the temporal evolution of the dynamics and predict quantitatively the structure's apparent bending moduli, at different confining pressures (see e.g., FIG. 5A).

The stiffening of a structure of this type requires very small volume shrinkage of the envelope (e.g., less than 5%). This is because jamming is a sharp phase transition with a small change in the particle packing fraction. As comparison, for the same virtual experiments performed on assemblies composed of the same hollow octahedrons, but without topological interlocking, the interlocked structures outperform loose aggregates by exhibiting a higher bending modulus at the same confining pressure (e.g., about three times higher). This enhancement of modulus at the jammed state can be attributed to the tensile resistances between particles due to the topological interlocking, which is not present in the loose particle aggregates. In addition, the anisotropy for tensile deformations is much stronger than for bending deformations. This is because the 0°/90° loading direction in the reference configuration are principal directions of the particle connections.

In jammed granular media, the macroscale mechanical rigidity is directly related to the number of contacts (a micro-structural quantity) formed within the system. Constitutive material properties usually play a secondary role as long as the particles remain rigid. The contact number for each particle within the structure can vary at different external pressures.

Higher external pressures induce more inter-particle contacts. Further dividing inter-particle contacts into "compressive" and "tensile" categories ("compressive" contact refers to how each particle experiences a contact force pointing towards its center, while "tensile" contact refers to how each particle experiences a force pointing away from its center), two observations can be made:

(i) "Tensile" contacts encompass clusters of "compressive" contacts in a semi-periodic pattern. This observation can be explained by the specific interlocking topology of the hollow octahedron: "tensile" contacts can only occur near each particle's vertices, which are away from the particle's centroid. "Compressive" contacts can occur in the void volume occupied by each particle, which are closer to the particle's centroid. This kind of "compressive" contacts within a particle's occupied volume is typically not possible for conventional convex granular particles.

(ii) Inter-particle contacts between two fabric layers are all "compressive" contacts, which is due to the fact that there is no interlocking between fabric layers.

Variations of Structures

Figures 7A, 7B:
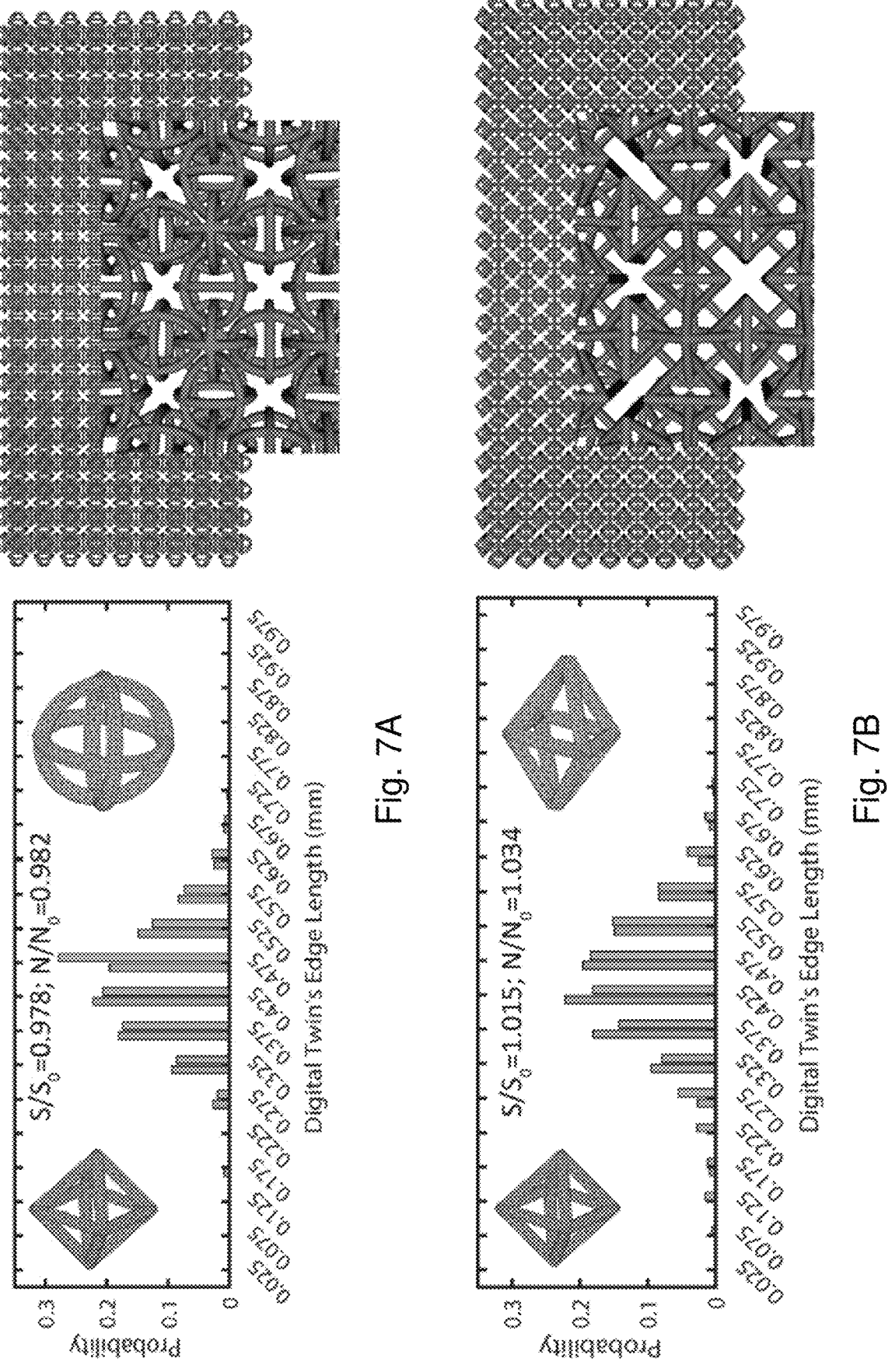
FIGS. 7A-7G show examples of combinations of different unit particle geometries.
Figures 7C, 7D:
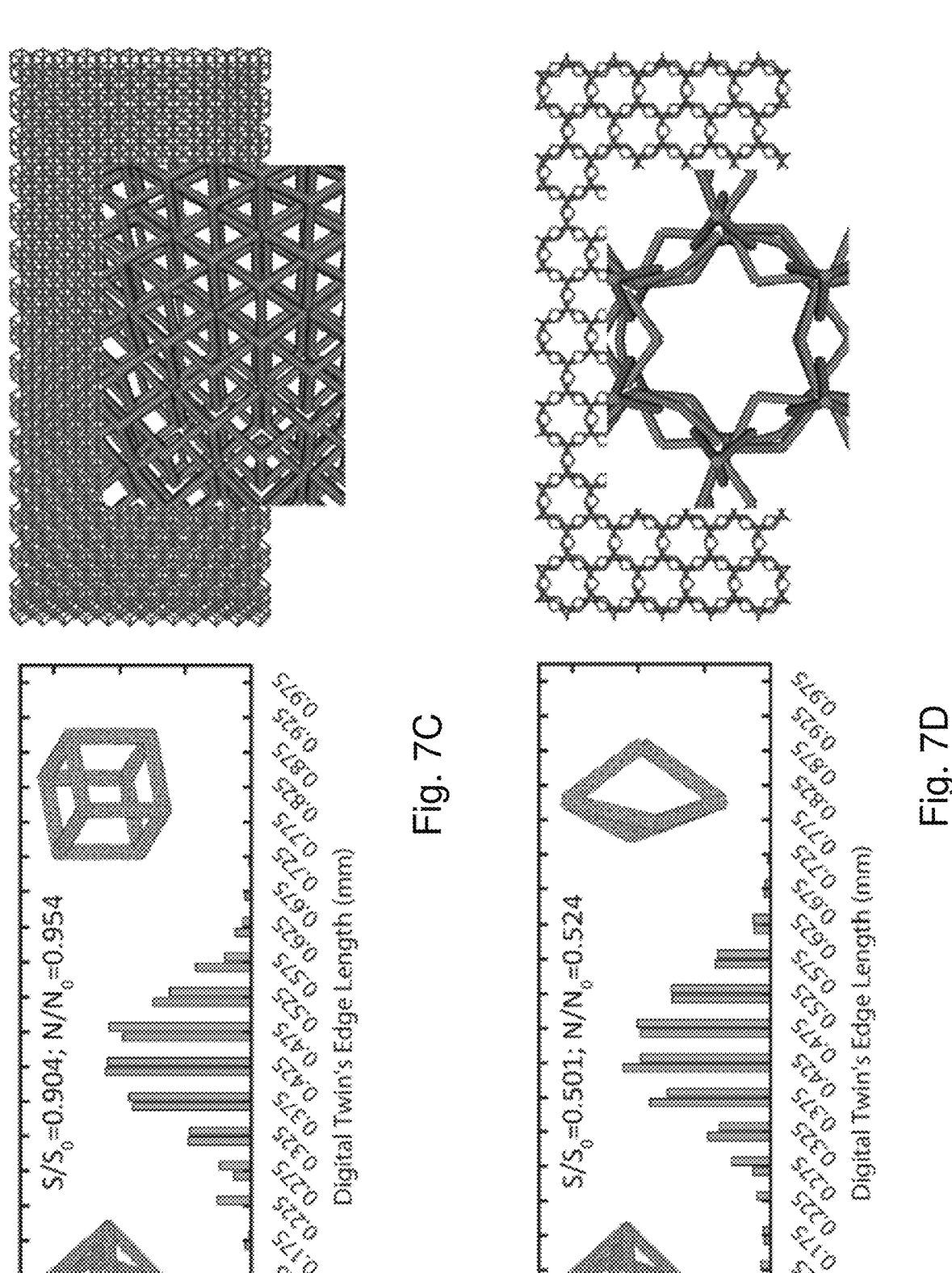
Figures 7E, 7F:
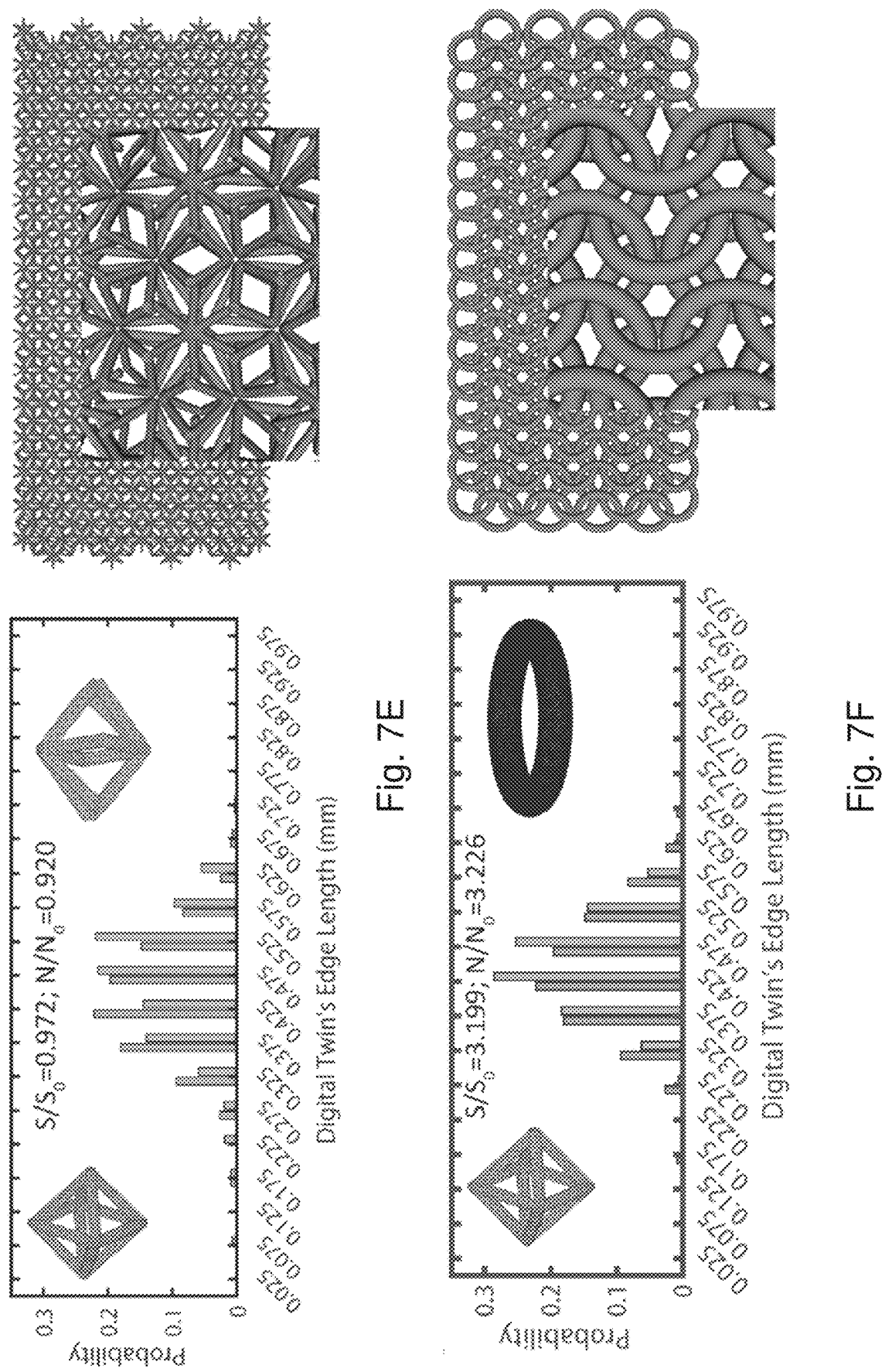
Figure 7G:
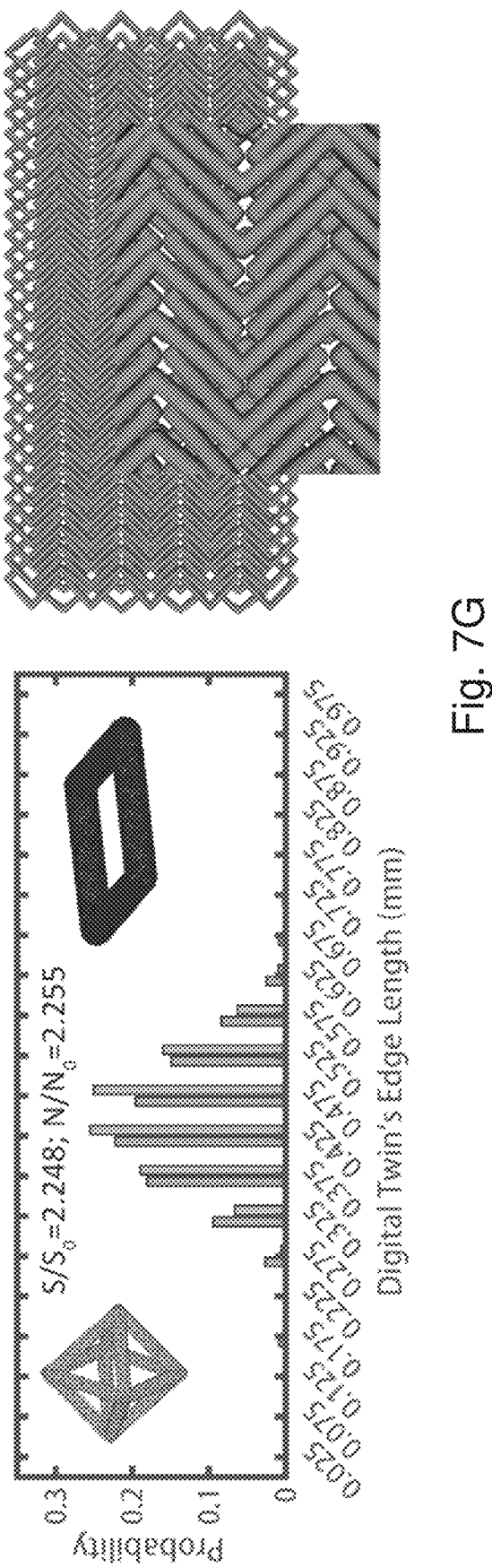

While the structures can be made homogenously of a single particle geometry, they can also be composed of interlocked particles of different geometries or variations of a geometry (that is, made of multiple types of particles). Examples of hybrid geometry sheets are shown in FIGS. 7A-7G. FIG. 7A shows a combination of an octahedral geometry with a spherical geometry. FIG. 7B shows a combination of two octahedral geometries having different dimensional ratios. FIG. 7C shows a combination of an octahedral geometry with a cubic geometry. FIG. 7D shows a combination of two octahedral geometries having different numbers of trusses. FIG. 7E shows a combination of an octahedral geometry with a 6-sided star-shaped geometry. FIG. 7F shows a combination of an octahedral geometry with a ring-shaped geometry. FIG. 7G shows a combination of an octahedral geometry with a square-shaped geometry.

Uses of Tuned Stiffness

These structures have a wide variety of uses. The following are a list of examples, but other uses can be understood by those skilled in the art.

Clothing—the sheets can be incorporated into clothing for a number of uses

Fashion—the tunability of fabric incorporating the structure allows for attire that can shift its shape while being worn Protection—a pliable chain-mail like protective garment can be adjusted while worn to have a more plate-like protection for different hazardous situations, including projectile impact, piercing damage, etc.

Form-fitting—the fabric can tune its stiffness to make the apparel easier to put on and/or remove (e.g., thigh-high boots)

Spacecraft or a similar vehicle/craft—the structures can be built into components that are rolled up or folded away when in a flexible state, then unfurled and made rigid when in use (e.g., antennae, solar panels, wheels, etc.)

Pipe patches—the structures, encased in a waterproof envelope, can be conformed around pipes (water, gas, oil, etc.) and made rigid to seal around a pipe breach Toys—the structures can be incorporated into toys to allow for an interactive kinetic nature to the toy, including simple "fidget" toys used for stress relief Therapeutic/medical—the structures can be used medically as specialized clamps/bandages, reconfigurable and protective casts, compression clothing (e.g., for sensory issues or circulatory issues), strain belts/harnesses (e.g., for weightlifting, where the body itself can provide the external pressure through change of position), or other similar devices Robotics—the structures can be used in variable stiffness robotic parts such as robotic joints. The structures in flexible mode can allow actuation of the joints, while in rigid state the actuation can be immobilized Shock absorption—the structures, possibly as 3D interlocking structures depending on the use, can be used as materials that automatically increase their bending modulus when struck, such as for a bumper of a vehicle or bullet/bomb resistant clothing Storage—the structures can be used as containers (boxes, bags, luggage, etc.) such that the flexibility of the container can change for different uses. For example, a bag that can temporarily stiffen to make filling the bag easier, then become flexible again to minimize the volume it takes up. Or luggage that is flexible for storage, but made rigid to protect the contents when needed Temporary shelter—the structures can be incorporated into a tent-like habitat that can be rolled up for transport, but provide stiffened walls for better protection from the elements Infrastructure materials—the structures, on a large scale, can be used as transportable roads, bridges, dams, walls, etc.

Figure 9:
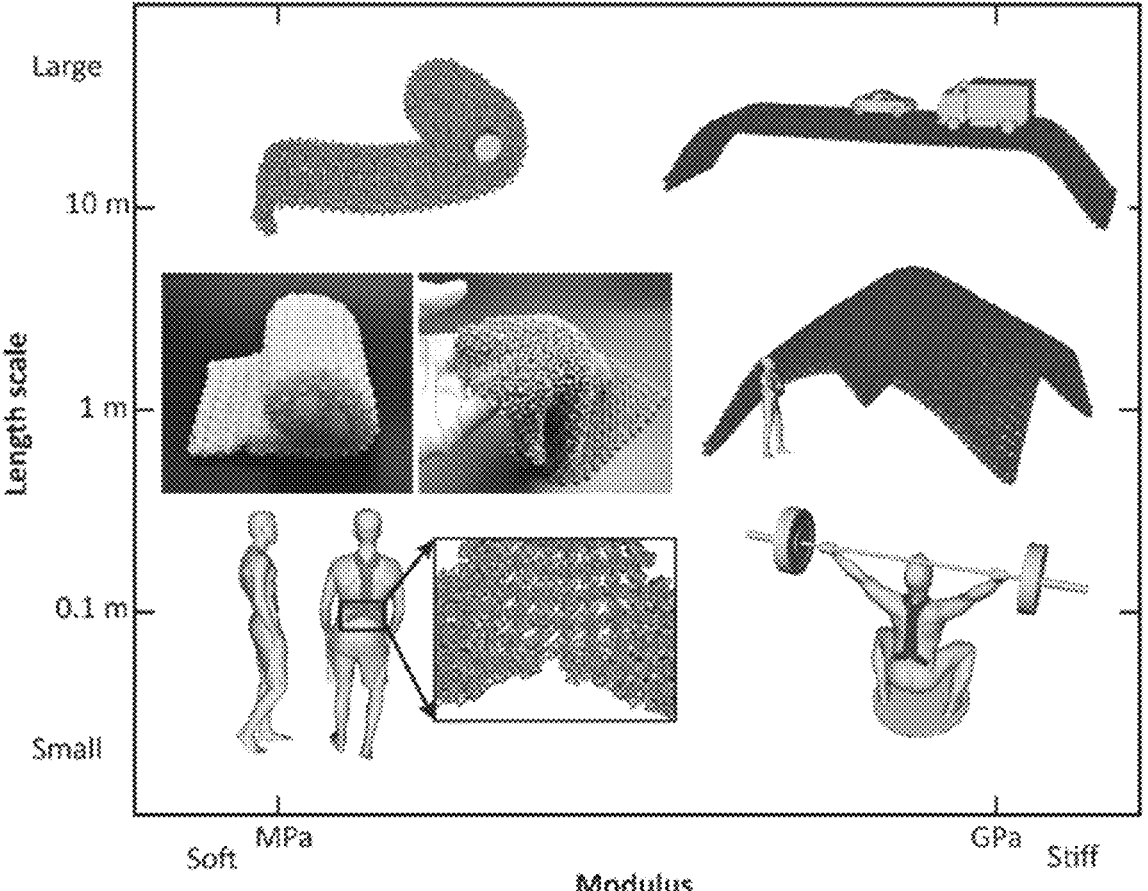
FIG. 9 shows a relative graph of size vs. modulus for different example uses of the structure.

Different uses would require different materials for the particles (e.g., plastic, metal, etc.), different scales (both of particle size and overall structure size, and different ranges of modulus of bending. FIG. 9 shows a graph of different structures at different scales of size and what they look like between a "soft" (flexible) modulus and a "stiff" modulus.

Fabrication

While the particles of a structure can be fashioned/formed individually and then later linked together mechanically to form a sheet or structure, it can be advantageous, particularly for smaller particle designs, to form the particles already in an interlinked configuration.

This can be accomplished, for example, by 3D printing techniques such as selective laser sintering, vat photopolymerization, material jetting, material extrusion, binder jetting, direct energy deposition, powder bed fusion, sheet lamination, stereolithography, wax casting, and the like. The materials can include metals/alloys (e.g., aluminum, AlSi10Mg, titanium, steel, copper, brass, etc.), plastics (e.g., acrylate, nylon, thermoplastic polyurethane, etc.), or similar materials (e.g., glass, carbon fiber, etc.). The particles can be individually coated (e.g., oxide, plastic, etc.) for extra protection.

EXAMPLE

Materials and manufacturing: Nylon plastic structured chain mail sheets are 3D printed via selective laser sintering (SLS) using a commercial 3D printing service (Shapeways™). The material used to print the fabric is PA 2200 nylon plastic, with density of 0.93 g/cm3, tensile modulus of 1.7 GPa and tensile strength 48 MPa (www.shapeways.com/materials/versatile-plastic). The equivalent density of the printed fabric is ~0.18 g/cm3, which is lower than most wearable materials.

The flexile envelop is made of Polyethylene Plastic film (McMaster-Carr) with thickness of $h_m$=0.076 mm and elastic modulus $E_m \approx 0.3$ Gpa. The membrane's contribution to the measured apparent bending moduli, E*, should be no greater than the E* measured at near zero confining pressure (~1 MPa). At higher confining pressures, the membrane forms wrinkles that significantly reduce the overall tensile resistance and its contribution to the overall bending moduli. Because of the presence of wrinkles, the membrane's contribution at higher confining pressures can be neglected in analysis. The aluminum chain mails are printed on a metal 3D printer (EOS™ M 290) with customized break-away supports, which allowed removal of the supports from the chain mail. The material used for printing was EOS Aluminum AlSi10Mg.

Quasi-static and impact mechanical tests: The bending stiffness of the fabrics enclosed within air-tight envelopes, at different confining pressures, is characterized with 3-point bending tests. The membrane envelope is first placed around the fabrics and the opening is sealed using a heat sealer. A soft tube connects from inside the envelope to a manual vacuum pump with pressure gauge. Different vacuum pressures are applied using the pump and the envelope is then sealed for testing. The membrane naturally wrinkles when vacuum is applied to conform to the fabric surface, which largely reduces its resistance upon stretching. The supports of the bending test have a width of 10 mm. An Instron™ E3000 materials tester was used, displacement controlled at a loading rate of 0.5 mm/s. Five separate tests are repeated at each confining pressure. Before each test, the fabrics are manually reset to a flat initial configuration. The deviation observed between the results from different tests at the same pressure arises from the initial configurations of the layers, which have different random initial contacts between the two chain mail sheets. In the impact tests, the structures are suspended between two metal supports at the edges and impacted using a stainless-steel sphere of mass m=30 g. The impact velocity, v0=3 m/s, is set by the sphere's initial drop height. The impact is recorded using a high-speed camera (Phantom Vision Research™) at a rate of 3000 frames/second, to track the position of the sphere during impact.

Calculating the fabric's apparent bending modulus. The stiffness of the initial elastic regime in the 3-point bending measurement was obtained by linearly fitting the force-displacement curve at small indentation depths (0 to 0.5 mm). This small indentation corresponds to in-plane strain of <0.05%, which ensures the structures are deforming within elastic limit. The overall dimensions (L, h and b) of the structures in the envelope at different confining pressures are measured before the 3-point bending tests. The apparent bending modulus is computed according to equation (1), using the measured dimensions and stiffness (slope) of the elastic regime.

Conclusion

A number of embodiments of the disclosure have been described. Nevertheless, it will be understood that various modifications may be made without departing from the spirit and scope of the present disclosure. Accordingly, other embodiments are within the scope of the following claims.

The examples set forth above are provided to those of ordinary skill in the art as a complete disclosure and description of how to make and use the embodiments of the disclosure and are not intended to limit the scope of what the inventor/inventors regard as their disclosure.

Modifications of the above-described modes for carrying out the methods and systems herein disclosed that are obvious to persons of skill in the art are intended to be within the scope of the following claims. All patents and publications mentioned in the specification are indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only and is not intended to be limiting. As used in this specification and the appended claims, the singular forms "a," "an," and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

The invention claimed is:

1. An apparatus comprising:
   a structure composed of a plurality of sheets layered on each other, each sheet comprising interlocking particles having intertwined geometries; and
   a means to apply external pressure to the structure such that the interlocking particles become jammed and increase the stiffness of the structure.

2. The apparatus of claim 1, wherein each of the plurality of sheets is not interlocked with any other sheet of the plurality of sheets.

3. The apparatus of claim 1, wherein the means to apply external pressure comprises an envelope surrounding the structure that is impermeable to a given fluid and a pump, connected to the envelope, configured to selectively change the amount of the given fluid in the envelope.

4. The apparatus of claim 1, wherein the interlocking particles are all the same geometric shape.

5. The apparatus of claim 1, wherein the interlocking particles are of two or more geometric shapes.

6. The apparatus of claim 1, wherein at least some of the interlocking particles are hollow octahedrons.

7. A garment comprising the apparatus of claim 1 and a compartment in the garment to hold the apparatus.

8. A portable tent comprising the apparatus of claim 1 surrounded by a flexible waterproof material.

9. A robotic joint comprising the apparatus of claim 1 for controllable actuation.

10. An antenna comprising the apparatus of claim 1, wherein the interlocking particles comprise metal.

11. A body harness comprising the apparatus of claim 1, wherein the means to apply external pressure to the structure is the configuration of the body harness such that a change in body position of the wearer creates the external pressure.

12. A patch for a pipe comprising the apparatus of claim 1 surrounded by a flexible material that is impermeable to a fluid flowing in the pipe.

13. A vehicle safety device comprising the apparatus of claim 1 shaped as a vehicle bumper.

14. A storage device comprising the apparatus of claim 1 shaped to surround objects on at least five sides.

* * * * *